United States Patent
Müller

(10) Patent No.: US 11,616,183 B2
(45) Date of Patent: Mar. 28, 2023

(54) ALLOY, SINTERED ARTICLE, THERMOELECTRIC MODULE AND METHOD FOR THE PRODUCTION OF A SINTERED ARTICLE

(71) Applicant: Vacuumschmelze GmbH & Co. KG, Hanau (DE)

(72) Inventor: Michael Müller, Wörth (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 134 days.

(21) Appl. No.: 16/517,331

(22) Filed: Jul. 19, 2019

(65) Prior Publication Data
US 2020/0044132 A1 Feb. 6, 2020

(30) Foreign Application Priority Data
Jul. 20, 2018 (DE) ...................... 10 2018 117 553.1

(51) Int. Cl.
H01L 35/26 (2006.01)
C22C 30/00 (2006.01)
H01L 35/34 (2006.01)
H01L 35/32 (2006.01)

(52) U.S. Cl.
CPC ............. H01L 35/26 (2013.01); C22C 30/00 (2013.01); H01L 35/32 (2013.01); H01L 35/34 (2013.01)

(58) Field of Classification Search
CPC ......... C22C 30/00; H01L 35/26; H01L 35/32; H01L 35/34
See application file for complete search history.

(56) References Cited

U.S. PATENT DOCUMENTS

| | | | |
|---|---|---|---|
| 2008/0066798 A1* | 3/2008 | Sakurada | ................ C22C 30/00 252/519.12 |
| 2009/0038667 A1* | 2/2009 | Hirono | ..................... H01L 35/32 136/200 |
| 2014/0314610 A1 | 10/2014 | Gerster et al. | |
| 2015/0270465 A1* | 9/2015 | Joshi | ....................... H01L 35/18 136/239 |
| 2016/0141480 A1 | 5/2016 | Zhu et al. | |
| 2016/0190421 A1 | 6/2016 | Mueller et al. | |
| 2018/0331268 A1 | 11/2018 | Zhu et al. | |

OTHER PUBLICATIONS

Fu, et al., Energy and Environmental Science, 2015, vol. 8, pp. 216-220 (Year: 2015).*
Yu, et al., Advanced Energy Materials, 2018, vol. 8, 1701313 (available online Sep. 2017) (Year: 2017).*
Ren, et al., Advanced Science, 2018, vol. 5, 1800278 (available online May 2018) (Year: 2018).*
Bhattacharya, et al., Journal of Materials Chemistry C, 2016, vol. 4, 11261 (Year: 2016).*
Chenguang Fu, et al., Are Solid Solutions Better in FeNbSb-Based Thermoelectrics?, Adv. Electron. Mater. 2016, 2, 1600394, pp. 1-6, Advanced Electronic Materials, www.advelectronicmat.de, www.MaterialsViews.com.

(Continued)

Primary Examiner — Sadie White
(74) Attorney, Agent, or Firm — Dickinson Wright PLLC

(57) ABSTRACT

An alloy is provided that consists essentially of
$(Ti_xTa_yV_zA_cNb_{1-x-y-z-c})(Fe_{1-d}Mn_d)_a(Sb_{1-e}Sn_e)_b$,
wherein $0.06 \leq x \leq 0.24$, $0.01 \leq y \leq 0.06$, $0/08 \leq z \leq 0.4$, $0.9 \leq (a,b) \leq 1.1$, $0 \leq c \leq 0.05$, $0 \leq d \leq 0.05$ and $0 \leq e \leq 0.1$ and A is one or more of the elements in the group consisting of Zr, Hf, Sc, Y, La, and up to 5 atom % impurities.

8 Claims, 20 Drawing Sheets

(56) References Cited

OTHER PUBLICATIONS

Junjie Yu, et al., High Performance P-Type Half-Heusler Thermoelectric Materials, Journal of Physics D: Applied Physics, J. Phys. D: Appl Physics 51 (2018) 113001 (15pp).
Junjie Yu, et al., Unique Role of Refractory Ta Alloying in Enhancing the Figure of Merit of NbFeSb Thermoelectric Materials, Advanced Energy Materials. Thermoelectric Materials.
J. Yu et al., "High performance p-type half-Heusler thermoelectric materials" J. Phys D. Appl. Phys. 41,2018. S 1-113001-1-113001-15.
C. Fu et al., "Are solid solutions better in FeNbSb-based thermoelectrics?" Adv. Electron. Mater 2016, 2, 1600394.
J. Yu et al., "Unique role of refractory Ta alloying in enhancing the figure of merit of NbFeSb thermoelectric materials" Adv. Energy Mater. 2017, 1701313.
S. Chen and Z. Ren "Recent progress of half-Heusler for moderate temperature thermoelectric applications" Materials Today Nr. 16, p. 387 , 2013.
S. Sakurada und N. Shutoh, "Effect of Ti substitution on the thermoelectric properties of (Zr, Hf) NiSn half-Heusler compounds," Applied Physics Letters, Bd. 86, p. 08210, 2005.
C. Fu, T Zhu, Y. Liu, H. Xie und X. Zhao, "Band engineering of high performance p-type FeNbSb based half-Heusler thermoelectric materials for figure of merit zT > 1," Energy & Environmental Sciecne, p. 216, 2015.
C. Fu, S. Bai, Y. Liu, Y. Tang, L. Chen, X. Zhao und T. Zhu, "Realizing high figure of merit in heavy-band p-type half-Heusler thermoelectric materials," Nature Communications, p. 9144, 2015.

\* cited by examiner $y = 0$ $y = 0{,}06$ y = 0,03

ALLOY, SINTERED ARTICLE, THERMOELECTRIC MODULE AND METHOD FOR THE PRODUCTION OF A SINTERED ARTICLE

This U.S. patent application claim priority to German application no. 10 2018 117 553.1, filed Jul. 20, 2018, the entire contents of which is incorporated herein by reference.

BACKGROUND

1. Field of Invention

The invention relates to an alloy, in particular a half-Heusler alloy having a positive Seebeck coefficient, to a sintered article, a thermoelectric module and a method for the production of a sintered article.

2. Related Art

Thermoelectric effects permit the direct conversion of thermal energy into electrical energy and vice versa. In this context a distinction is made between the Seebeck effect and the Peltier effect depending on the application.

The Peltier effect describes how an electric current in a material is connected to a heat flow. The relationship between the heat flow and the electric current is referred to as the Peltier coefficient. The Seebeck effect describes how a difference in temperature between two ends of a material leads to the production of an electrical voltage proportional to the difference in temperature. The relationship between the voltage and the temperature difference is referred to as the Seebeck coefficient S.

Thermoelectric effects find technical applications in thermocouples for temperature measurement, in thermoelectric modules (TE modules) for heating/cooling and in thermoelectric modules for the generation of electric current, for example. Thermoelectric modules for heating and cooling are also referred to as Peltier modules, while modules for current generation are also referred to as thermoelectric generators (TEGs).

In order to produce thermocouples for a thermoelectric conversion device, efficient thermoelectric materials with a negative Seebeck coefficient (n-type materials) and efficient materials with a positive Seebeck coefficient (p-type materials) are required.

The efficiency of the materials is described by the thermoelectric figure of merit ZT, defined as $ZT=T\,S^2\sigma/\kappa$, where T is the absolute temperature, S the Seebeck coefficient, $\sigma$ the electrical conductivity and $\kappa$ the heat conductivity. In addition to the ZT value, the power factor PF, calculated using the equation $PF=S^2\sigma$, is also often used to compare different thermoelectric materials.

Half-Heusler compounds are intermetallic compounds with the general formula $\alpha\beta\chi$ that have an ordered cubic $C1_b$ crystal structure. A transition metal $\alpha$, a transition metal $\beta$ and a main group metal $\chi$ each occupy one of three nested, cubically face-centred sub-lattices. A fourth cubically face-centred sub-lattice is unoccupied. If the sum of the valence electrons in this structure is 18, the compounds exhibit a semi-conductive behaviour with an energy gap of 0 to 1 eV. They are, therefore, particularly suitable for use as efficient thermoelectric materials for an average temperature range of approx. 400° C. to 600° C.

Depending on their composition half-Heusler compounds can be n-type or p-type, i.e. can have a negative Seebeck coefficient or a positive coefficient. N-type thermoelectric half-Heusler compounds, e.g. $\alpha$NiSn-based compositions (where $\alpha$=Zr, Hf, Ti), and P-type thermoelectric half-Heusler compounds such as the $FeNb_{1-x}Ti_xSb$ system, for example, are disclosed in US 2016/0141480 A. The efficiency of n-type half-Heusler alloys is currently better than that of p-type half-Heusler alloys.

It is therefore desirable to provide thermoelectric materials with an improved figure of merit, in particular p-type thermoelectric materials with an improved figure of merit.

SUMMARY

According to the invention an alloy is provided that consists essentially of

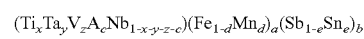

and up to 5 atom % impurities, wherein
$0.06 \leq x \leq 0.24$,
$0.01 \leq y \leq 0.06$,
$0.05 \leq z \leq 0.4$,
$0.9 \leq (a, b) \leq 1.1$,
$0 \leq c \leq 0.05$,
$0 \leq d \leq 0.05$,
$0 \leq e \leq 0.1$,
and A is one or more of the elements from the group consisting of Zr, Hf, Sc, Y, La.

The term "Impurities" is used herein to denote elements that are not intentionally added to the overall composition or which are caused by the production process. The impurities can be one or more elements from the group consisting of O, C, N, B, Si, Al and Mg.

The alloy according to the invention is a thermoelectric p-type material that can be described as a tantalum (Ta)-substituted thermoelectric p-type half-Heusler compound in the (Nb/V)FeSb system. As such it has a positive Seebeck coefficient and a half-Heusler structure. Using the general formula $\alpha\beta\chi$ for half-Heusler alloys, in the alloy according to the invention $\alpha$ denotes the elements Ti, Ta, Nb, V and optionally A, $\beta$ denotes the element Fe and optionally Mn and $\chi$ denotes the element Sb and optionally Sn.

According to the invention the Nb lattice site is substituted by both Ta and V. Surprisingly, it has been established that Ta in very small quantities has a positive influence on the thermoelectric properties of Ti-doped p-type NbFeSb compounds in which the Nb-lattice site is also partially substituted by V.

It is known from the prior art, e.g. from the article entitled "Unique Role of Refractory Ta alloying in enhancing the Figure of Merit of NbFeSb Thermoelectric Materials", Adv. Energy Mater. 2017, 1701313 by J Yu et al, that the substitution of an element by an isoelectronic and chemically similar element with a higher mass leads to a reduction in heat conductivity $\kappa$, the electronic properties being retained. In this way it is possible to improve the figure of merit ZT. The aforementioned article considers half-Heusler alloys with the composition $(Nb_{1-x}Ta_x)_{0.8}Ti_{0.2}FeSb$. In the article no clear increase in figure of merit is measured until a Ta content of x>0.2 is reached. In particular, the ZT achieved at 500° C. for Ta contents of up to x≤0.2 is only <0.8. The best figure of merit, on the other hand, is not obtained until x=0.36.

The improvement is due to the very similar chemical properties of Nb and Ta at very different masses. In contrast, V is described as an element unsuitable for the substitution of Nb since V has less favourable chemical properties than Nb, which leads to a deterioration in electronic properties such as Seebeck coefficient and electrical conductivity.

Consequently the high figure of merit described in the invention in compositions containing vanadium was surprising. In particular, the high figure of merit ZT recorded at the much lower Ta contents of 0.01 to 0.06 was unexpected. Contrary to the knowledge reflected in the prior art, a combination with a V substitution at Ta contents of y≤0.06 was also shown to have a clearly positive effect on the thermoelectric properties, as a result of which the alloy according to the invention has higher ZT values than comparable compounds not containing Ta. At 500° C. it is also possible to achieve a ZT value of ≥0.8 through a combination of V and Ta substitutions. The lower tantalum content is also advantageous since the material costs of tantalum are high.

In one embodiment the alloy has a maximum thermoelectric figure of merit $ZT_{max}$ of ≥0.8 and in a further embodiment the alloy has a thermoelectric figure of merit ZT of ≥0.8, where T=500° C.

The composition of the alloy can be defined more precisely as 0.01≤y≤0.045, preferably 0.01≤y≤0.035 and/or 0.075≤z≤0.3. In one embodiment c=0, d=0 and e=0 such that the alloy comprises $(Ti_xTa_yV_zNb_{1-x-y-z})Fe_aSb_b$. This embodiment can be described as the base alloy and can have substitutions by the elements A, Mn and Sb.

The statement 0.9≤(a, b)≤1.1 includes deviations from the ideal stoichiometry of 1:1:1 in the formula αβχ of a half-Heusler alloy since in practice deviations from this ideal stoichiometry of up to ±10%, for example, can be present. In theory, the sum of the valence electrons of a half-Heusler alloy that has a high thermoelectric effect is 18. In practice, however, deviations from this value are possible within a range of 17.5 to 18.5.

The alloy can be provided in various forms including a powder, a cast mass or a sintered article. For the production of a thermoelectric module, in particular, it is advantageous to be able to provide the alloy in solid or massive form for use as a thermoelectric element.

In one embodiment a sintered article is therefore provided with an alloy according to one of the preceding embodiments. In one embodiment the sintered article has an average grain size of greater than 1.25 μm and can thus be produced using industrial-scale powder-metallurgical processes. As a result there is no need for costly production processes such as nanostructuring.

In one embodiment the sintered article has a density D, D being ≥90% of the theoretical density $D_t$. This provides a mechanically stable part that can reliably be assembled with other parts to form a thermoelectric module.

According to the invention a thermoelectric module is provided having at least one thermoelectric element made of an alloy according to one of the preceding embodiments and at least one thermoelectric element made of an n-type alloy. This means that the thermoelectric module has at least one thermocouple comprising a first element made of a p-type material and a second element made of an n-type material. In practice, a thermoelectric module can have a plurality of thermocouples that are arranged electrically in series or in parallel.

The thermoelectric module can have at least one thermoelectric element comprising a sintered article according to one of the preceding embodiments and at least one thermoelectric element made of an N-type thermoelectric alloy.

According to the invention a method is provided for the production of a sintered article, the method comprising the following:
providing a starting material consisting essentially of

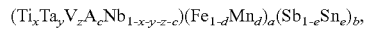

$(Ti_xTa_yV_zA_cNb_{1-x-y-z-c})(Fe_{1-d}Mn_d)_a(Sb_{1-e}Sn_e)_b$, wherein
0.06≤x≤0.24,
0.01≤y≤0.06,
0.05≤z≤0.4,
0.9≤(a, b)≤1.1,
0≤c≤0.05,
0≤d≤0.05,
0≤e≤0.1,
And A is one or more of the elements from the group consisting of Zr, Hf, Sc, Y, La and up to 5 atom % impurities,
melting the starting material and subsequent solidification to form at least one block,
crushing the block,
grinding the crushed block, thereby forming a powder,
cold pressing the powder, thereby forming a green body,
sintering the green body, thereby producing a sintered article for a thermoelectric element.

The sintered article is therefore produced using a powder-metallurgical method. In one embodiment the green body is sintered at a maximum pressure of 1 MPa and at a temperature of 900° C. to 1200° C. for 0.5 h to 24 h. The green body can be sintered in a protective gas or a vacuum. A protective gas such as argon, helium, hydrogen or forming gas, for example, can be used. A protective gas or a vacuum prevents the block or green body from oxidising.

The method is based on industrial-scale methods and permits the production of articles of different shapes using the powder-metallurgical methods of grinding, cold pressing and sintering. In consequence, it is possible to produce articles of a suitable shape and size for different thermoelectric conversion devices. A sintering process also enables the article produced to be produced with near net-shape dimensions so that it is possible to make a practical working component for a thermoelectric conversion device without or with only a minimum of further processing.

In this context the terms sintering process and sintering refer to a heat treatment that can be used to sinter grains and that is not carried out under high external pressure. For example, the heat treatment takes place under an external pressure of less than 1 MPa or 10 bar. Hot-pressing processes are therefore excluded since they use high external pressures on the green body during heat treatment.

It is, however, possible to produce the alloy according to the invention using a hot-pressing process.

The starting material can be made of pure elements or pre-alloys comprising two or more elements and can contain elements in ratios from which it is possible to form an alloy phase with a half-Heusler structure.

In further embodiments the composition can be defined more precisely as 0.01≤y≤0.045, preferably 0.01≤y≤0.035 and/or 0.075≤z≤0.3.

In one embodiment the base alloy with c=0, d=0 and e=0 is used as the starting material.

In one embodiment the sintered article has an average grain size of greater than 1.25 μm and/or a density D, D being ≥90% of the theoretical density $D_t$.

In one embodiment the method also comprises casting the molten starting material to form a block.

In a further embodiment the method also comprises homogenising the block. The homogenisation can be carried out at a temperature of 700° C. to 1200° C. for 0.5 h to 100 h, preferably at a temperature of 750° C. to 1050° C. for 12 h to 48 h. The phase purity of the alloy can be increased by this heat treatment. If the thermoelectric alloy according to the invention has a half-Heusler structure, homogenisation can be used to reduce further non-half-Heusler alloy phases. The block can be homogenised in a protective gas or a vacuum. The protective gas used can be argon, helium, hydrogen or forming gas, for example. A protective gas or vacuum prevent the block or green body from oxidising.

The block can be crushed by means of a jaw crusher or a disc or roller mill.

The grinding of the crushed block can take place in a plurality of steps. For example, the block can be crushed to a coarse powder, the coarse powder can be ground to a fine powder in a further grinding process and the fine powder can then be cold pressed. The further grinding process can be carried out by means of a planetary ball mill or a jet mill. This method can be used to further reduce the particle size.

In one embodiment the starting material is melted by means of vacuum induction melting. A vacuum induction melting method enables a large quantity of starting material to be melted in a melting process and is therefore suitable for industrial-scale processes.

In a further embodiment homogenisation of the sintered article is carried out at a temperature of 600° C. to 1000° C. for 0.5 h to 100 h, preferably at a temperature of 650° C. to 950° C. for 12 h to 72 h.

In one embodiment the thermoelectric article is processed to form a plurality of working components by means of sawing and/or grinding processes. The sawing process can be carried out by wire sawing, inner diameter sawing, wire cutting, water jet cutting and/or laser cutting. The grinding process can be carried out by disc grinding, twin-disc grinding, belt grinding and/or with a flat grinding machine.

DETAILED DESCRIPTION OF EXAMPLE EMBODIMENTS

Figure 1:
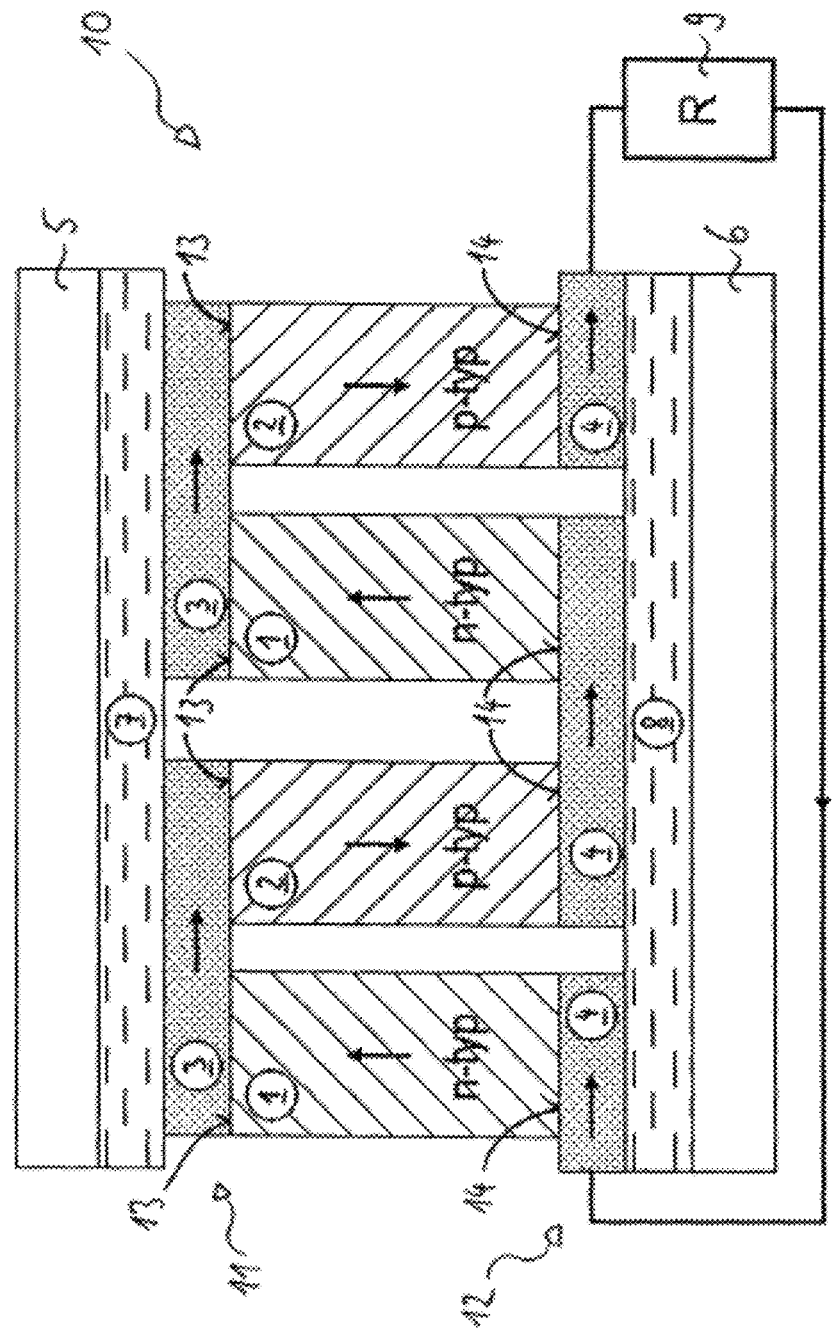
FIG. 1 shows a schematic view of a thermoelectric module.

FIG. 1 shows a schematic view of a thermoelectric module 10. The thermoelectric module 10 has thermoelectric elements 1 and 2 arranged in pairs, also referred to as legs, that are connected to one another by electrically conductive contact layers in the form of electrodes 3 and 4. The thermoelectric elements 1 and 2 each have a first face 13 and a second face 14 opposite the first face 13. In this arrangement the first electrode 3 is arranged partially on the first face 13 of the thermoelectric elements 1 and 2 and the second electrode 4 is arranged partially on the second face 14 of the thermoelectric elements 1 and 2.

By way of example, an n-type thermoelectric material that has a negative Seebeck coefficient is used for the first leg of a pair of elements, e.g. element 1, and a p-type thermoelectric material that has a positive Seebeck coefficient is used for the second leg, e.g. element 2.

A first side 11 of the thermoelectric module 10 is connected to a heat source 5 and an opposite second side 12 of the thermoelectric module 10 is connected to a heat sink 6. During operation of the thermoelectric module 10 the first side 11 thus forms a hot side and the opposite second side 12 forms a cold side of the thermoelectric module 10.

In the embodiment shown, the legs of a pair of elements, i.e. thermoelectric elements 1 and 2, are electrically connected in series. Owing to the opposite or complementary Seebeck effect, the current in the n-type leg, i.e. in thermoelectric element 1, flows from the cold to the hold side and the current in the p-type leg, i.e. in thermoelectric element 2, flows from the hot to the side back to the cold side. The external connections of thermoelectric module 10 can thus both be located on the cold side. The direction of the current flow is illustrated schematically in FIG. 1 by means of arrows.

As the current generated by the single pair of elements and the voltage are typically relatively low, in a thermoelectric module a plurality of thermoelectric elements 1 and 2 are preferably connected to one another, FIG. 1 showing only two pairs with thermoelectric elements 1 and 2 for reasons of clarity. It is possible to provide a current-voltage characteristic suitable for a given application by means of combinations of parallel and series connections, FIG. 1 showing a series connection. In this arrangement an electrical consumer 9 in the form of a resistor is illustrated schematically in FIG. 1.

In the thermoelectric module 10 operated as a thermoelectric generator a temperature gradient is produced by the leg by connecting the first side 11 of the thermoelectric module 10 to the heat source 5 and the opposite second side 12 to the heat sink 6. In the embodiment shown the thermoelectric elements 1 and 2 and the contact layers in the form of electrodes 3 and 4 are electrically insulated by means of insulating layers 7 and 8 in relation to the heat source 5 and the heat sink 6 to avoid short circuits. The insulating layers 7 have good heat conductivity to enable effective heat conduction from the heat source 5 and to heat sink 6 to and/or from the thermoelectric elements 1 and 2.

In applications involving thermoelectric generators two factors in particular are relevant, namely the efficiency of the thermoelectric generator and mechanical and thermal stability at the relevant operating temperatures and in temperature cycling.

The achievable efficiency of a thermoelectric generator is limited by the maximum possible efficiency of a heat to electrical energy conversion process. This is set by the Carnot efficiency $\eta Carnot=\Delta T/Th$, where $\Delta T$ denotes the temperature difference between the hot and the cold side, i.e. between the first side 11 and the second side 12 in the embodiment shown, and Th denotes the temperature of the hot side, i.e. of the first side 11.

The percentage of Carnot efficiency that can be exploited by a thermoelectric generator is influenced in particular by the thermoelectric efficiency of the thermoelectric materials (TE materials) used for the leg. At a temperature T high-efficiency materials have maximum possible Seebeck coefficient S, good electrical conductivity σ and low heat conductivity κ. This is summarised in the thermoelectric figure of merit ZT.

According to the invention an alloy is provided that consists essentially of $(Ti_xTa_yV_zA_cNb_{1-x-y-z-c})(Fe_{1-d}Mn_d)_a(Sb_{1-e}Sn_e)_b$, where $0.06 \leq x \leq 0.24$, $0.01 \leq y \leq 0.06$, $0.05 \leq z \leq 0.4$, $0.9 \leq (a, b) \leq 1.1$, $0 \leq c \leq 0.05$, $0 \leq d \leq 0.05$ and $0 \leq e \leq 0.1$. A denotes to one or more of the elements in the group consisting of Zr, Hf, Sc, Y and La. The alloy can contain up to 5 atom % impurities. This alloy has a positive Seebeck coefficient and a half-Heusler structure and can be used as a p-type in a thermoelectric module as shown in FIG. 1, for example.

Example 1—Comparative Example

Samples of a compound with a nominal composition of $Ti_{0.2}Ta_{0.1}V_{0.42}Nb_{0.28}FeSb$ were produced using a powder-metallurgical process. To this end the starting elements in the given composition were first melted by means of vacuum induction melting. The ingot was further processed by means of homogenisation at 950° C. for 24 hours in argon as a protective gas and then ground to a fine powder with a median grain size of between 1 µm and 10 µm. The powder was pressed into green bodies in a tool press at a pressure of 2 t/cm² and sintered at 1080° C. for 8 hours in a vacuum ($10^{-2}$ mbar) to form a dense body. The sintered samples were then homogenised again at 950° C. for 24 hours in argon as an inert gas. The density of the samples was 8.1 g/cm³.

Figure 2:
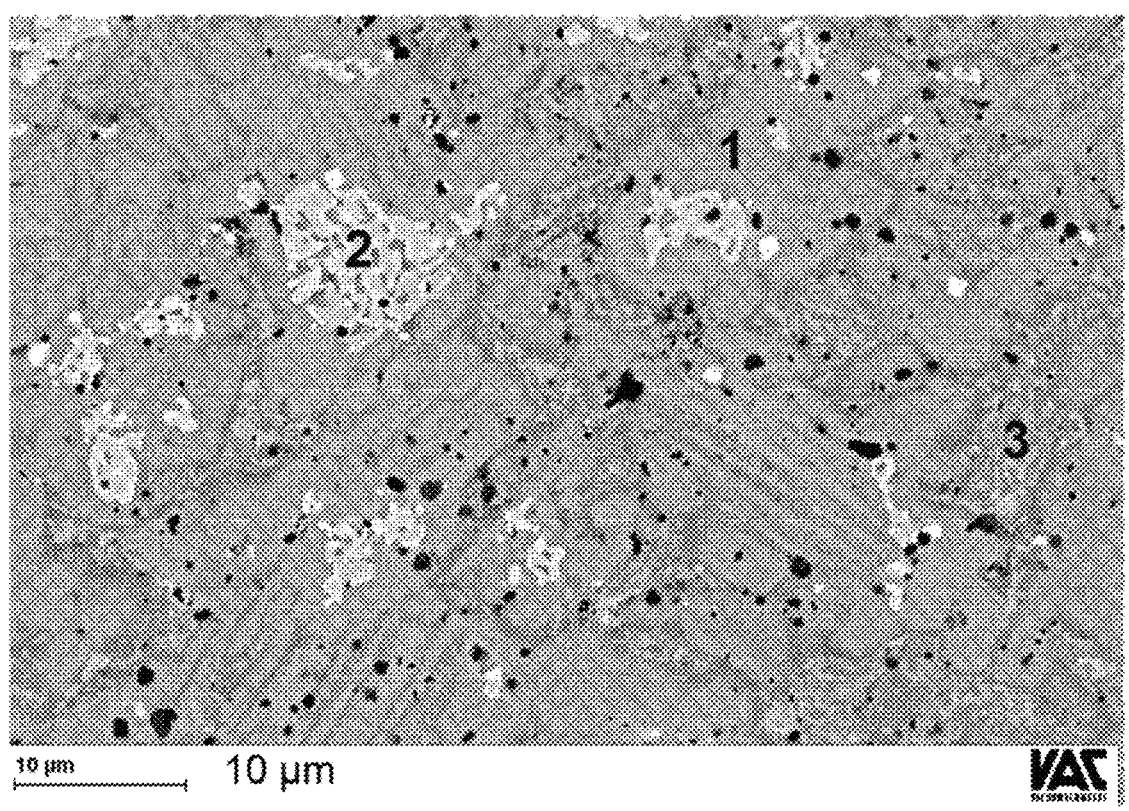
FIG. 2 shows a scanning electron microscope image of the microstructure from Example 1.

The microstructure of the samples produced in this manner was examined using scanning electron microscopy (SEM). The result is shown in FIG. 2. It primarily shows three different structural constituents, the composition of which was analysed by means of energy-dispersive x-ray spectroscopy (EDXS). According to the EDXS analysis, the uniformly grey areas 1 in the SEM image have a composition of approx. 33% (Ti+Ta+V+Nb), 33% Fe and the rest Sb (in atom %) and can thus be assigned to half-Heusler phases. Here the portion of Ta in the total Ti+Ta+V+Nb measured using EDXS is a maximum of 6%, i.e. the Ta added was not able to dissolve completely into the half-Heusler phase. The excess Ta can be identified in FIG. 2 in the light Ta-rich precipitations 2, which contain primarily Fe and smaller amounts of V and NB in addition to Ta. The light/dark structured regions 3 are Sb-rich foreign phases with the approximate composition 50% Sb, 25% Fe, rest V+Nb. Here the lighter regions have a higher percentage of Nb, the darker regions a higher percentage of V.

Example 1 therefore shows that for NbFeSb compounds comprising Ti, Ta and a V content of more than 0.4, a Ta content of more than 0.06 leads to a high percentage of foreign phases 2 and 3. The thermoelectric properties measured for these samples with the molecular formula $Ti_{0.2}Ta_{0.1}V_{0.42}Nb_{0.28}FeSb$ were poor, e.g. a ZT value at 500° C. of only 0.4.

Example 2—According to the Invention

The influence of the Ta content in a composition comprising Ti, V and Nb was investigated in greater detail. Compounds with a reduced Ta content corresponding to the molecular formula $Ti_{0.2}Ta_yV_{0.24}Nb_{0.56-y}FeSb$ where y=0; 0.03; 0.04 and 0.06 were produced. The compounds were produced as in Example 1; the sintering temperatures varied between 1070° C. and 1090° C.

Figure 3A:
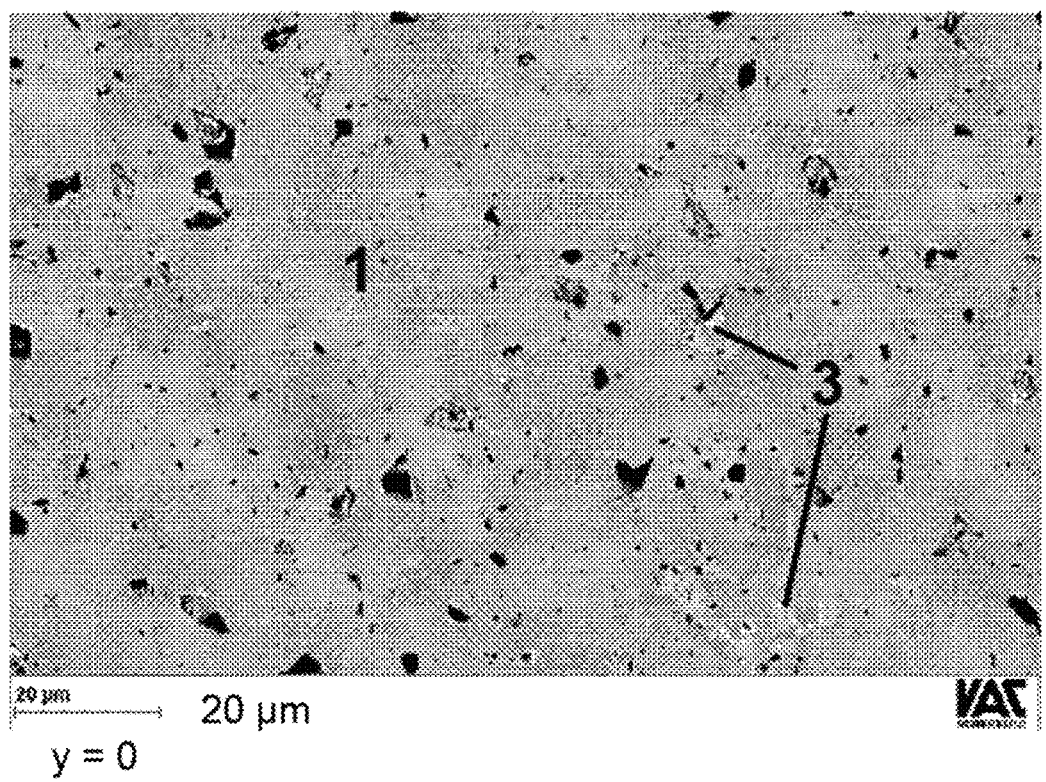
FIGS. 3a-3c show scanning electron microscope images of the microstructure of the compounds from Example 2 with the molecular formula $Ti_{0.2}Ta_yV_{0.24}Nb_{0.56-y}FeSb$.
Figure 3B:
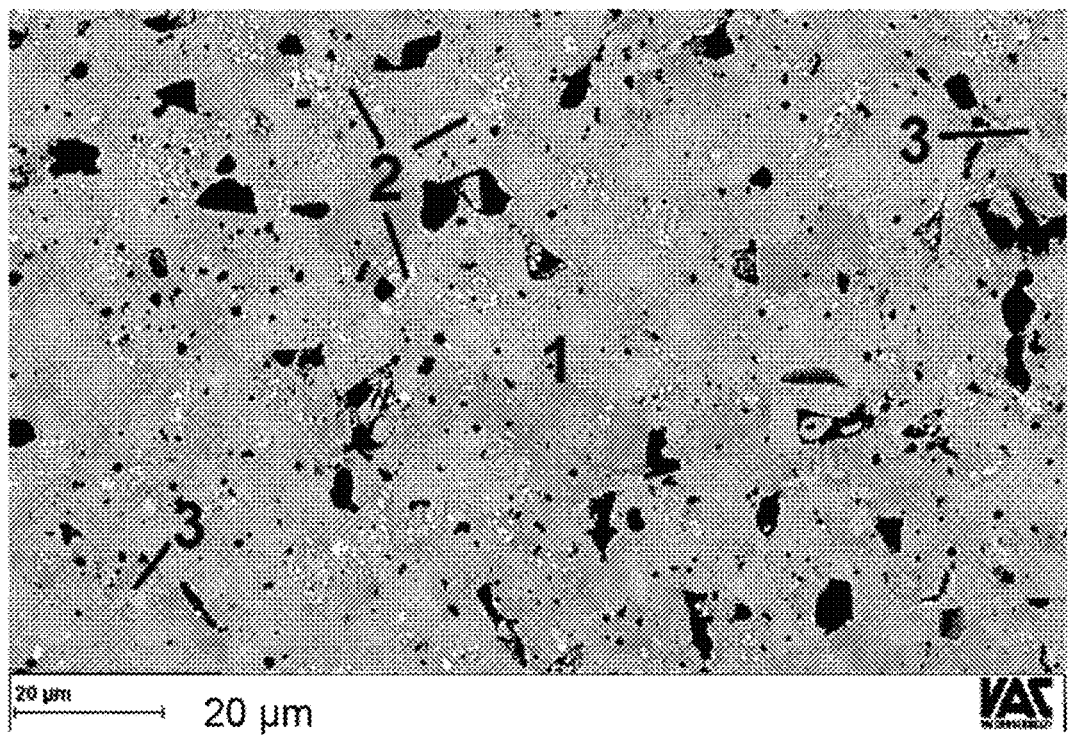
Figure 3C:
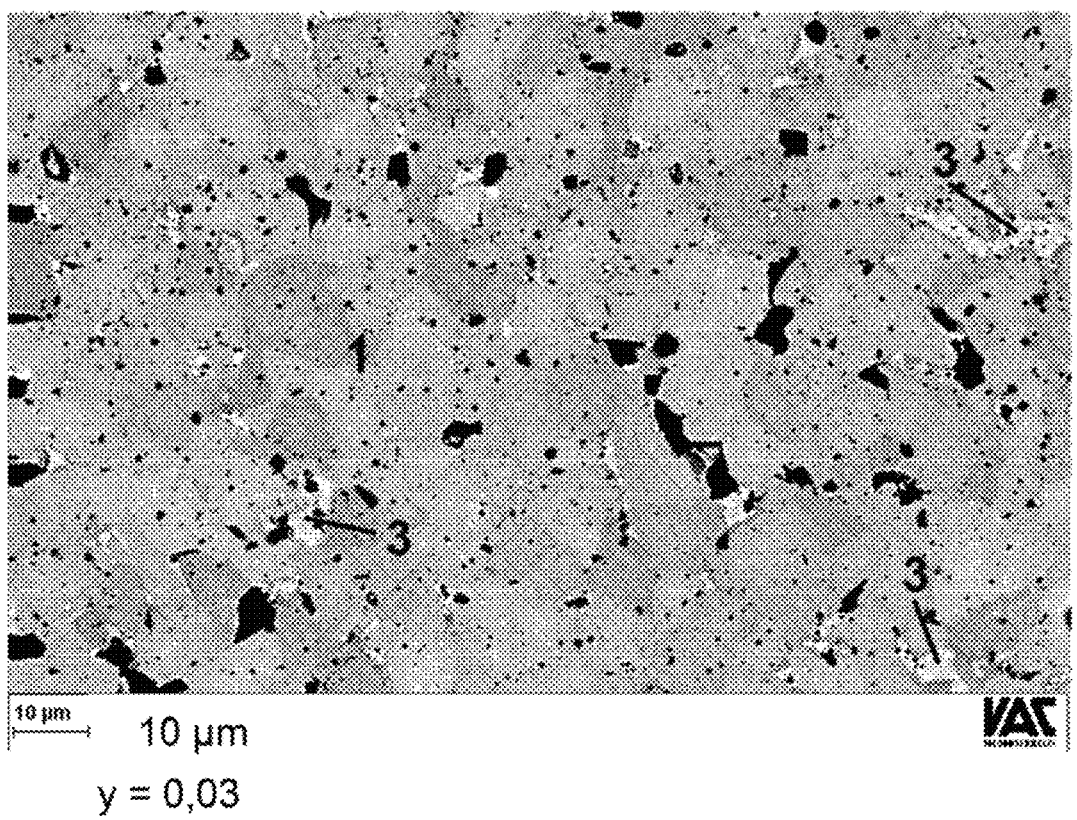

The microstructure of the compounds was examined using SEM. The results for Ta contents of y=0; 0.03 and 0.06 are shown in FIG. 3.

In the Ta-free sample with y=0 the structure consists predominantly of half-Heusler phases 1. EDXS was able to demonstrate the presence of only a small number of Sb—Fe-rich foreign phases 3. The pores in this sample visible in FIG. 3 correspond to a porosity of approx. 3.7%, estimated by comparing the density of sample of 7.77 g/cm³ and the theoretical density of the compound of 8.07 g/cm³.

Here the theoretical density is calculated using the lattice constants measured in the article "Are Solid Solution Better in FeNbSb-Based Thermoelectrics?", Advanced Electronic Materials, p. 1600394 2016 by C. Fu, Y. Liu, X. Zhao, & T. Zhu.

Figure 4:
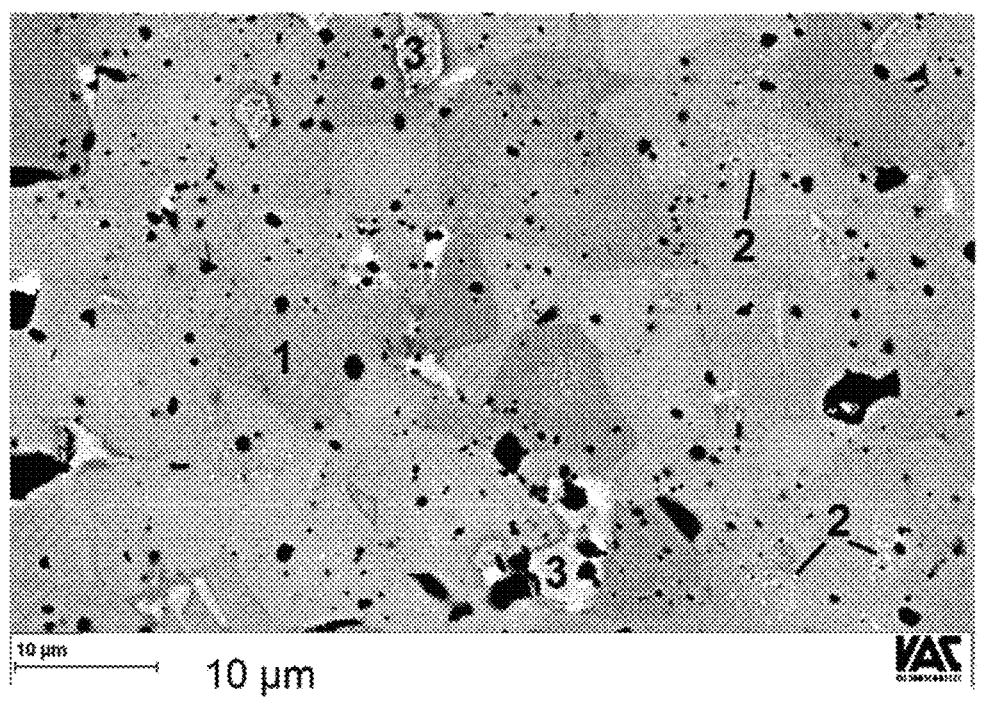
FIG. 4 shows an enlarged section of a scanning electron microscope image of the compound $Ti_{0.2}Ta_{0.03}V_{0.24}Nb_{0.53}$ from Example 2.

FIG. 3 again shows Ta-rich precipitations 2 as foreign phases in the sample with the highest Ta content y=0.06. The enlargement in FIG. 3 shows only the half-Heusler matrix 1 and Sb—Fe-rich precipitations 3 in the sample with the average Ta content y=0.03. Only at the higher magnification in FIG. 4 can the very finely distributed individual Ta-rich precipitations 2 be detected. A Ta content of the half-Heusler phase of approx. Ta/(Ti+Ta+V+Nb)=0.025 was measured in the sample using EDX.

Figure 5:
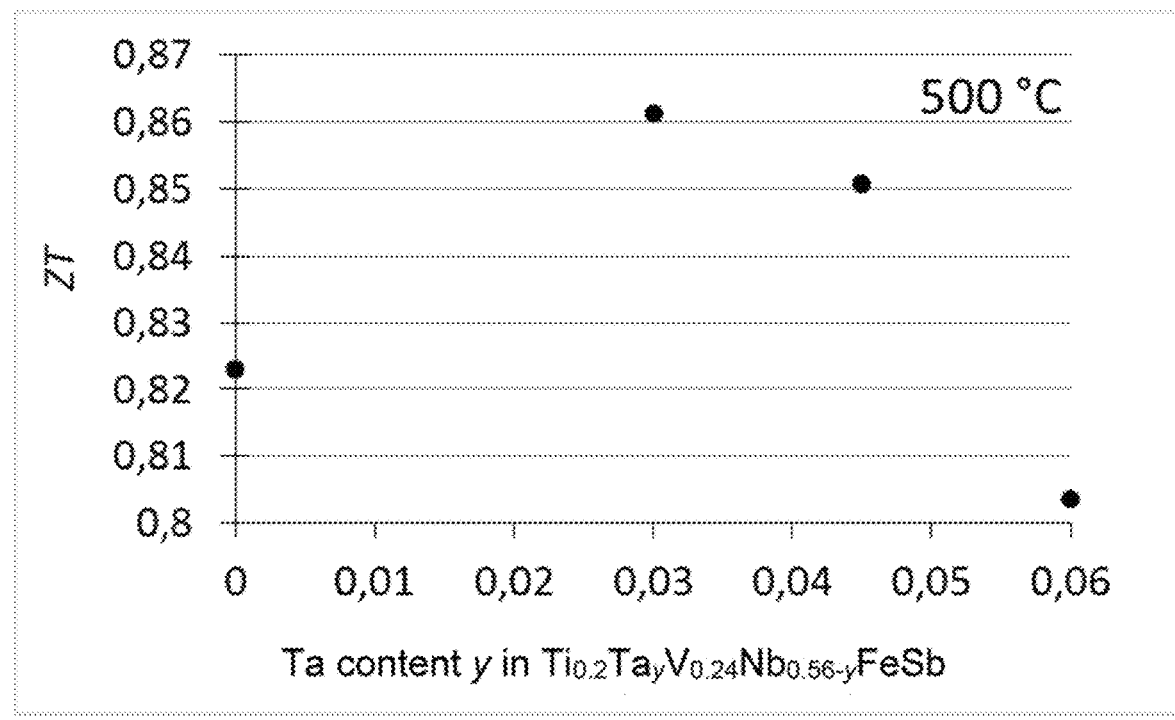
FIG. 5 shows a graph of ZT values of the samples from Example 2 at 500° C.
Figure 6A:
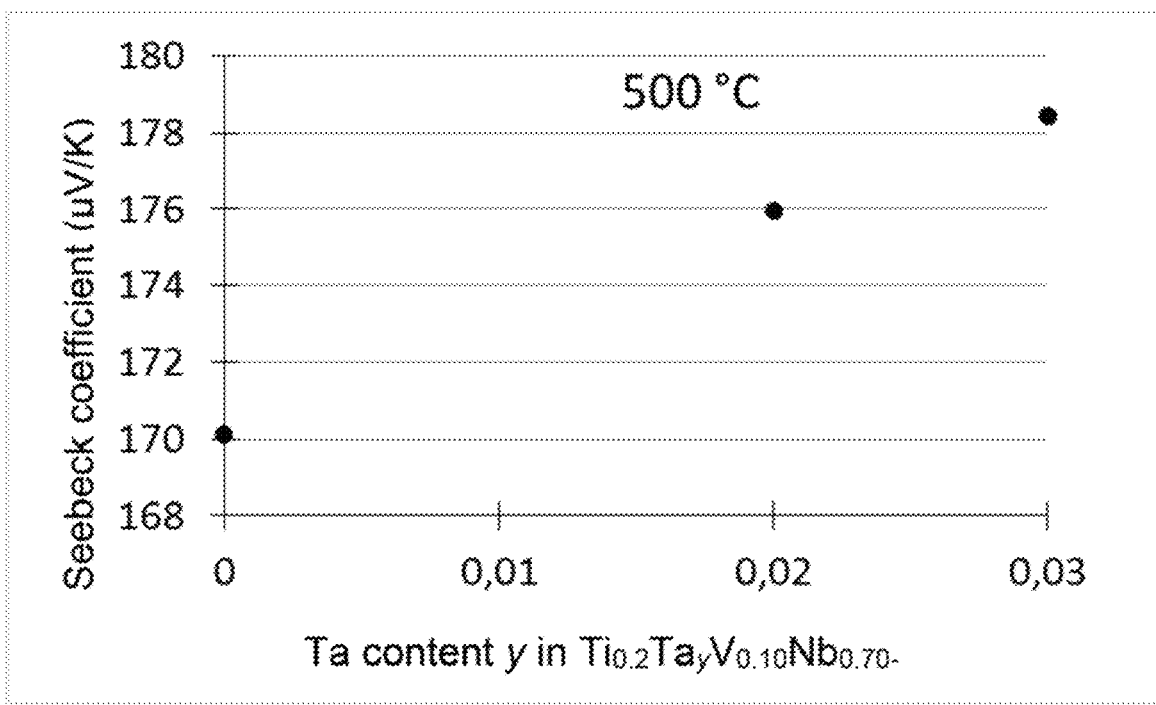
FIGS. 6a-6e show thermoelectric properties of the materials from Example 3 at 500° C.
Figure 6B:
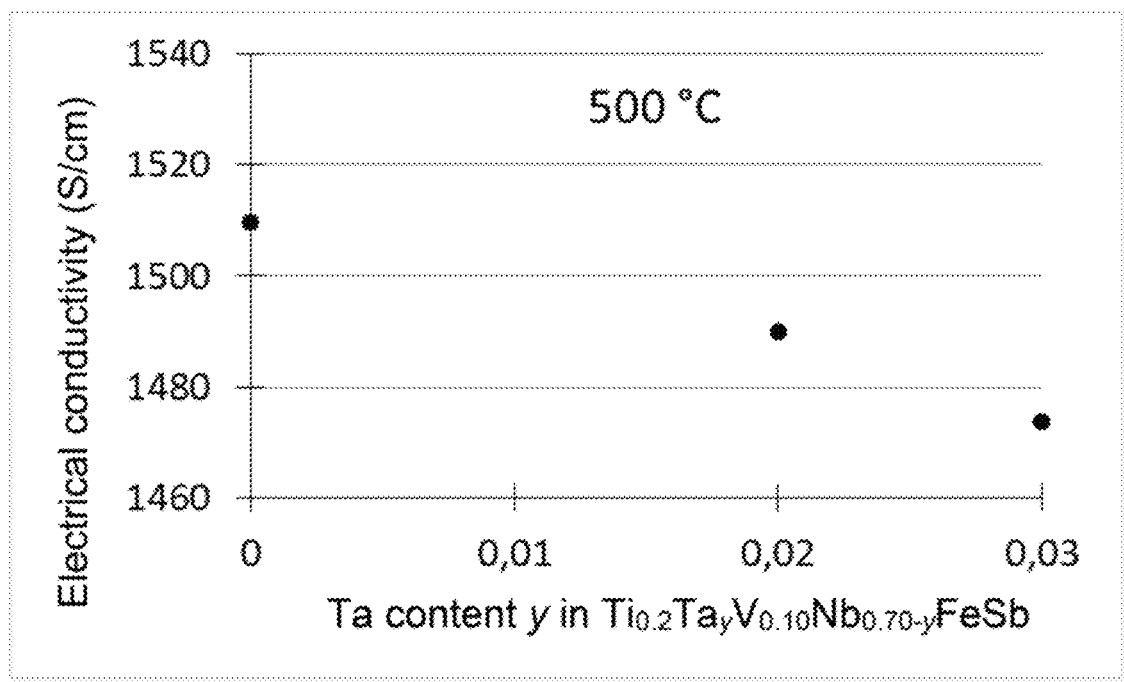
Figure 6C:
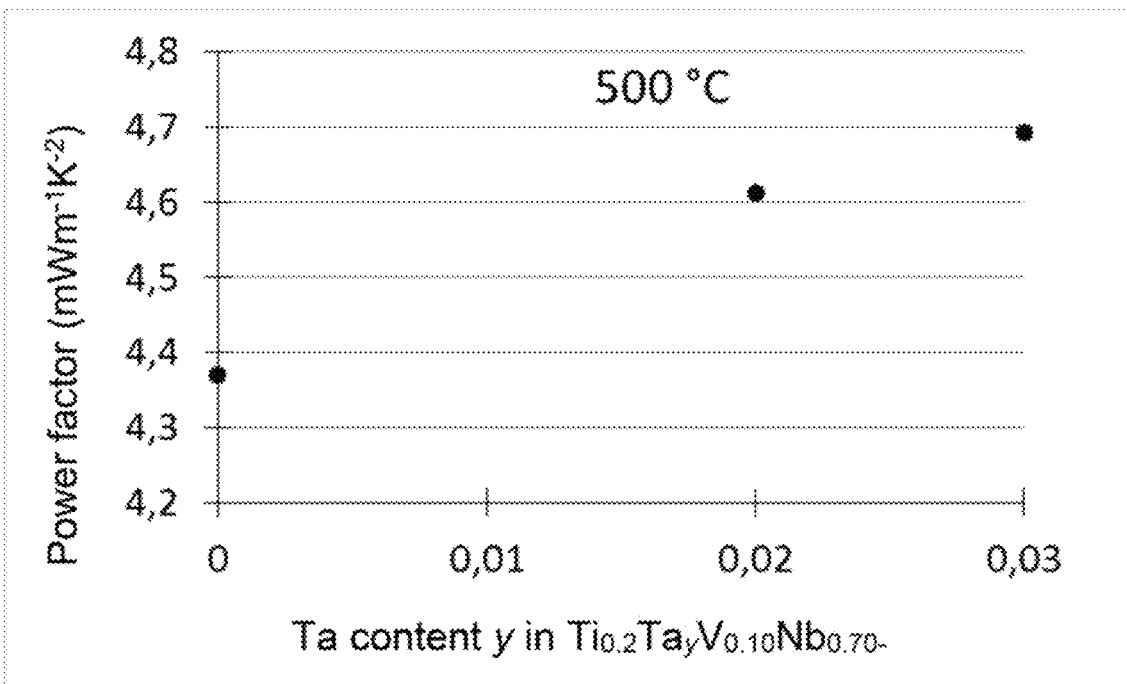
Figure 6D:
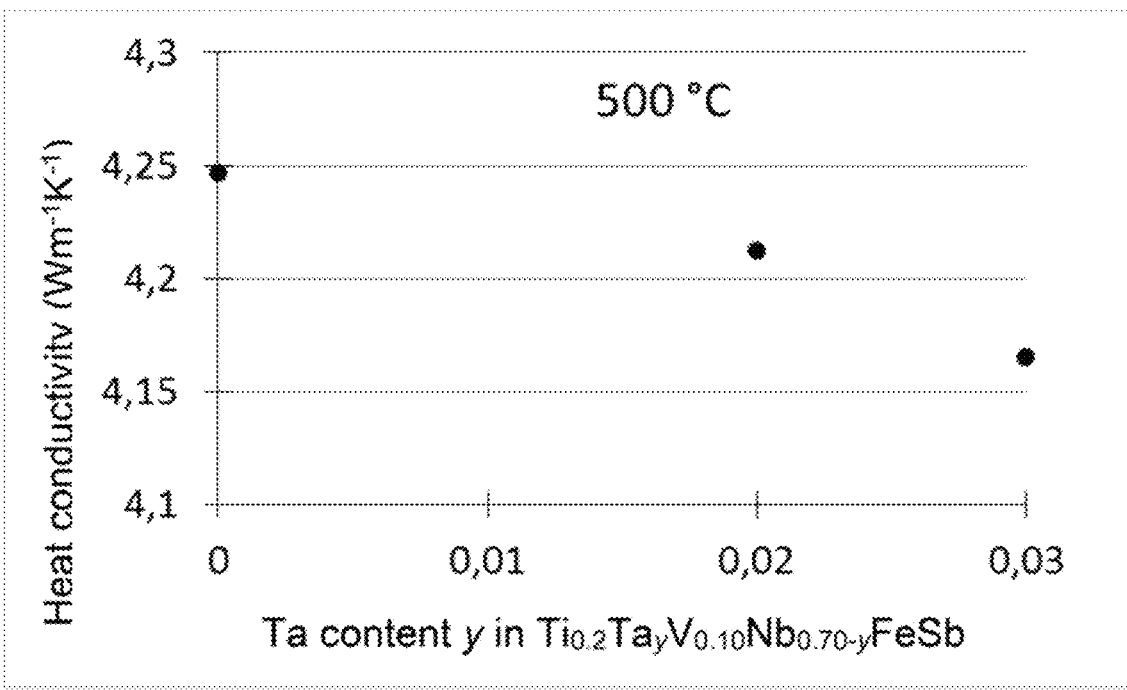
Figure 6E:
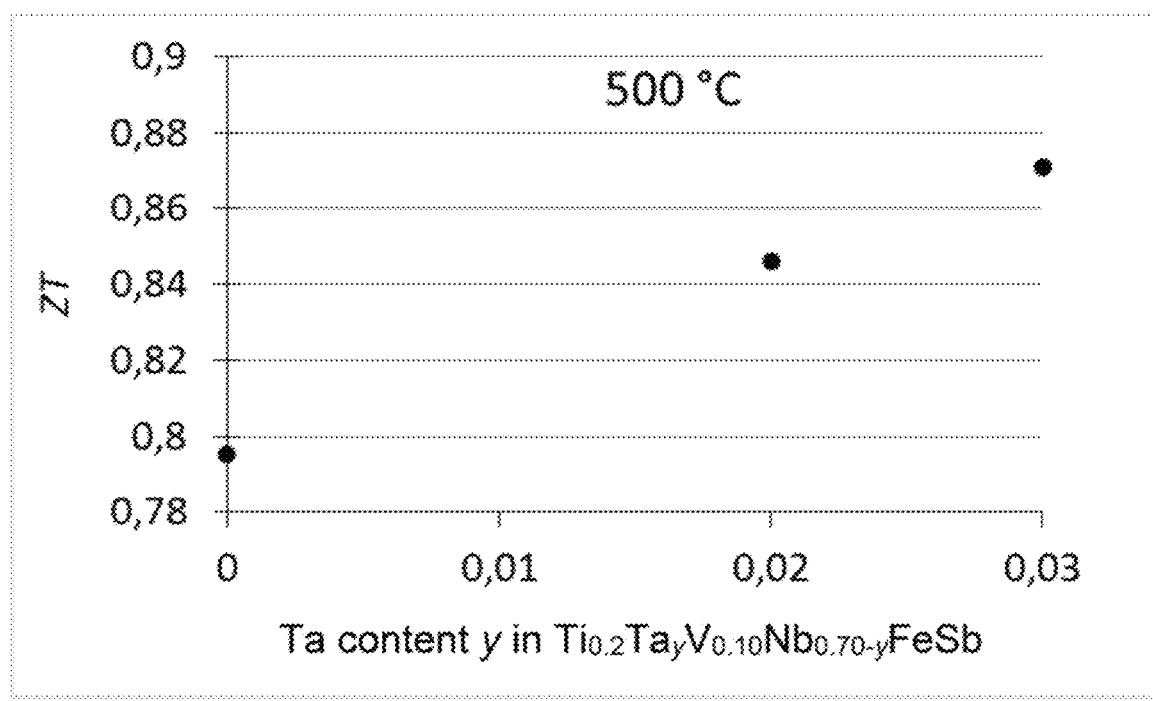
Figure 7A:
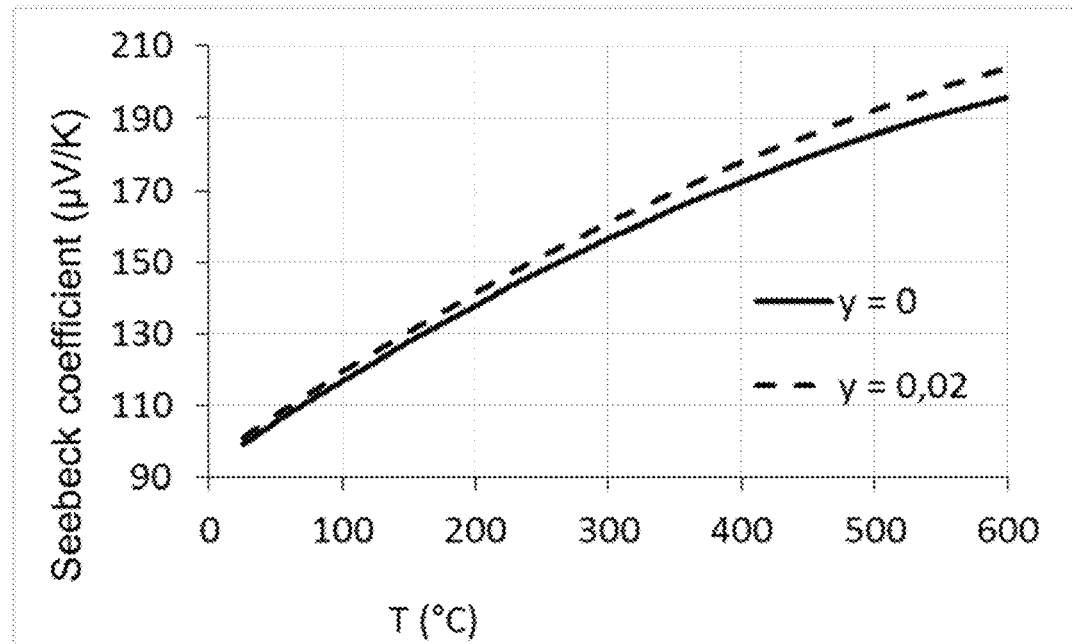
FIGS. 7a-7e show thermoelectric properties of the $Ti_{0.2}Ta_yV_{0.18}Nb_{0.62-y}FeSb$ compounds from Example 4.
Figure 7B:
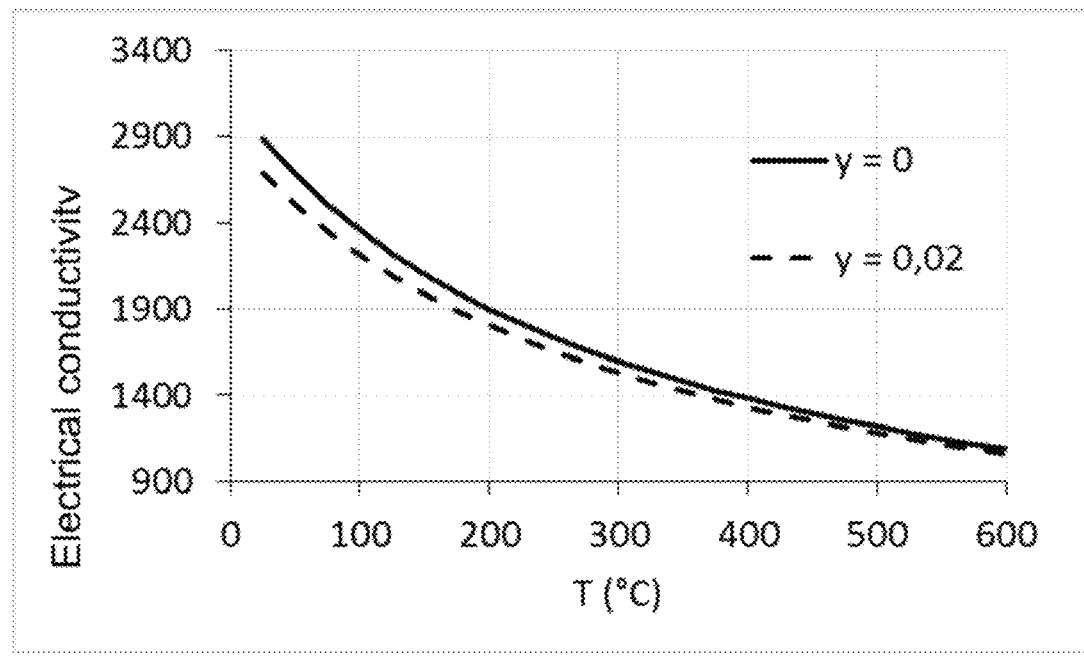
Figure 7C:
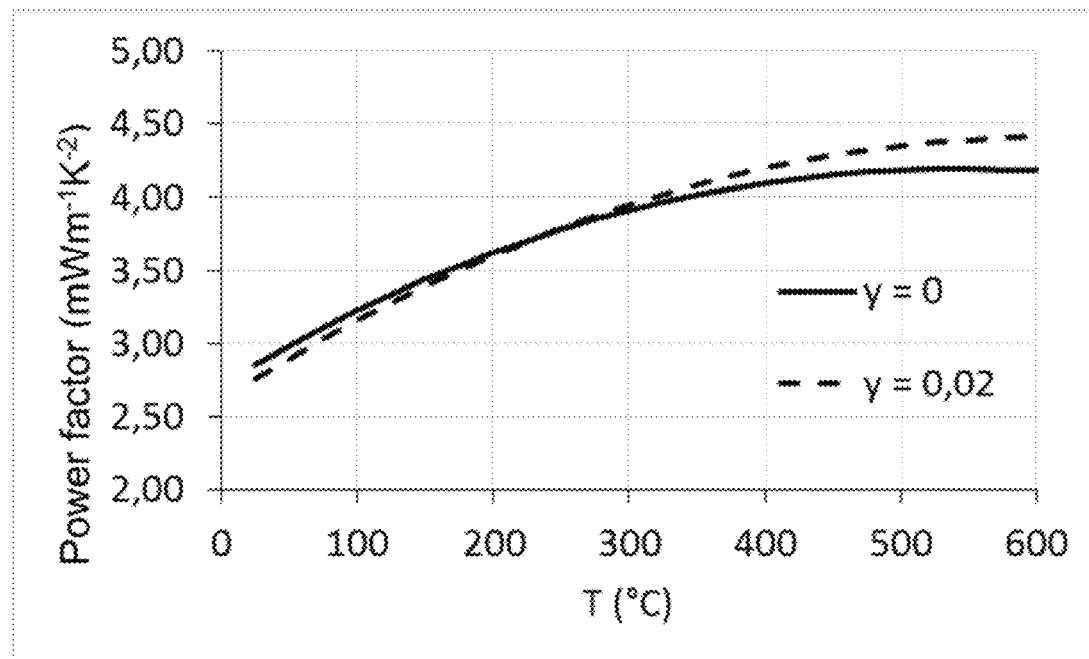
Figure 7D:
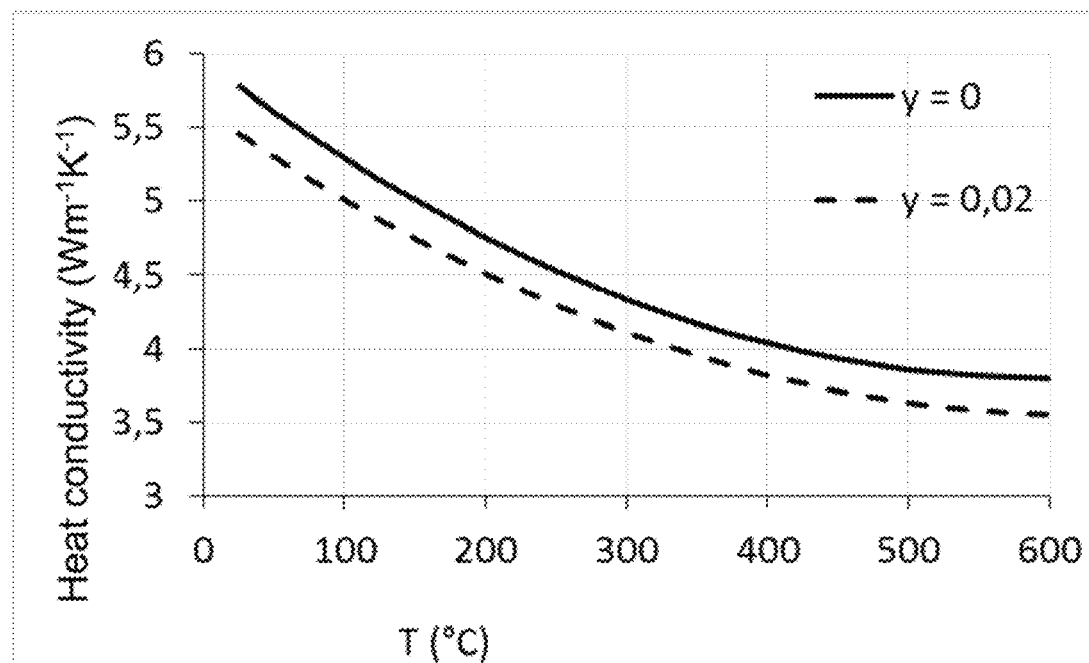
Figure 7E:
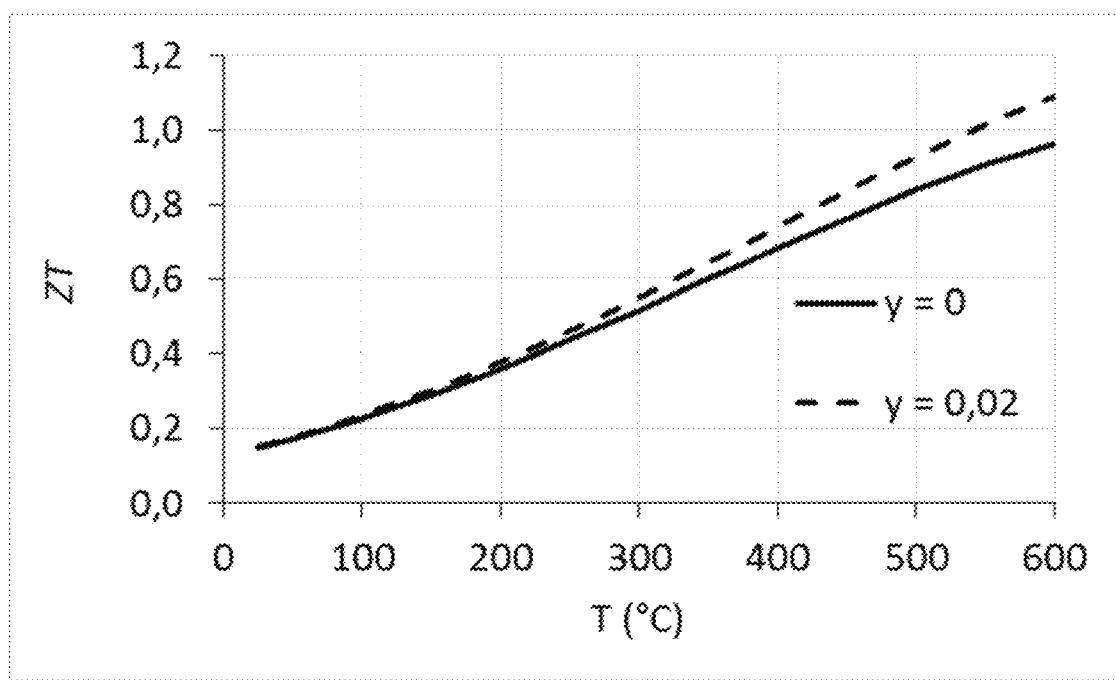
Figure 8A:
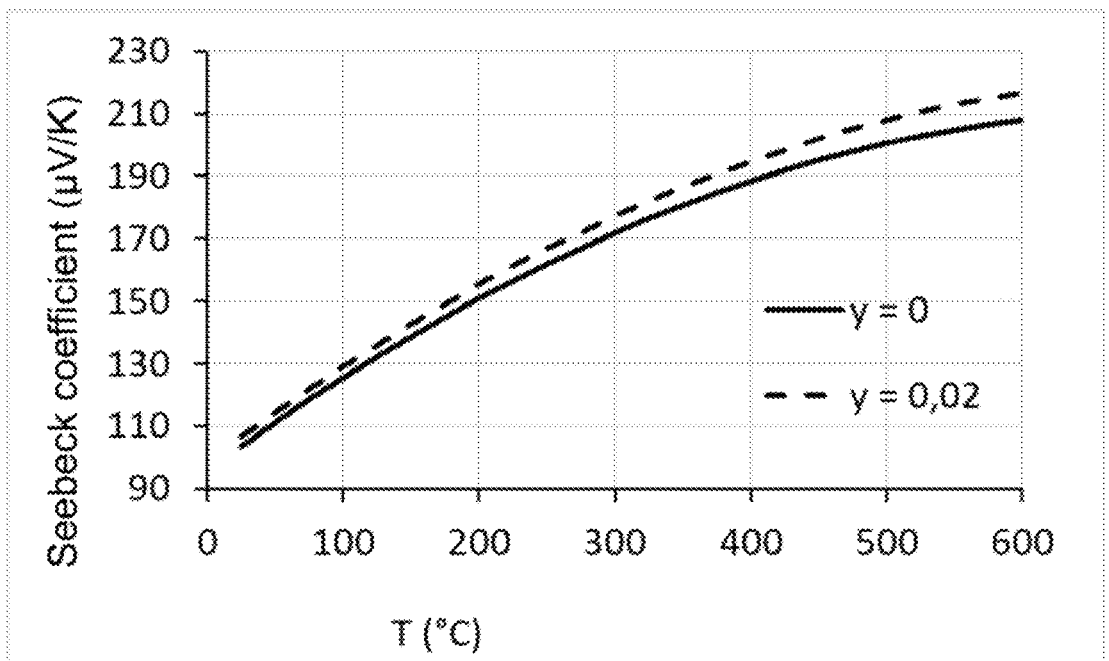
FIGS. 8a-8e show thermoelectric properties of the $Ti_{0.16}Ta_yV_{0.25}Nb_{0.59-y}FeSb$ compounds from Example 5.
Figure 8B:
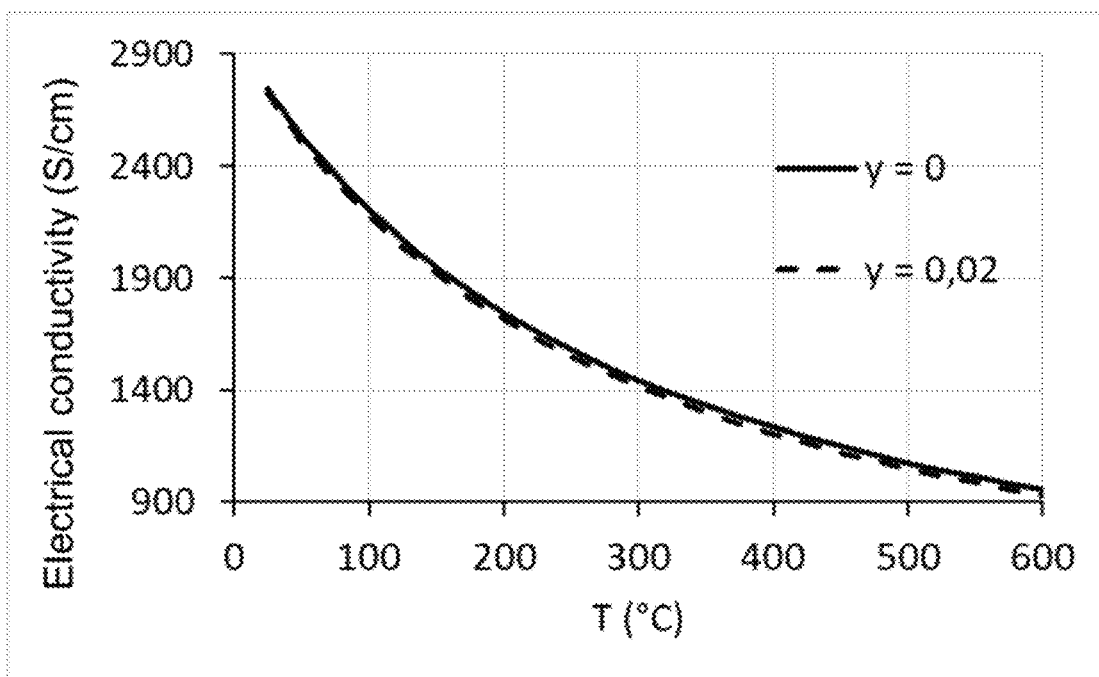
Figure 8C:
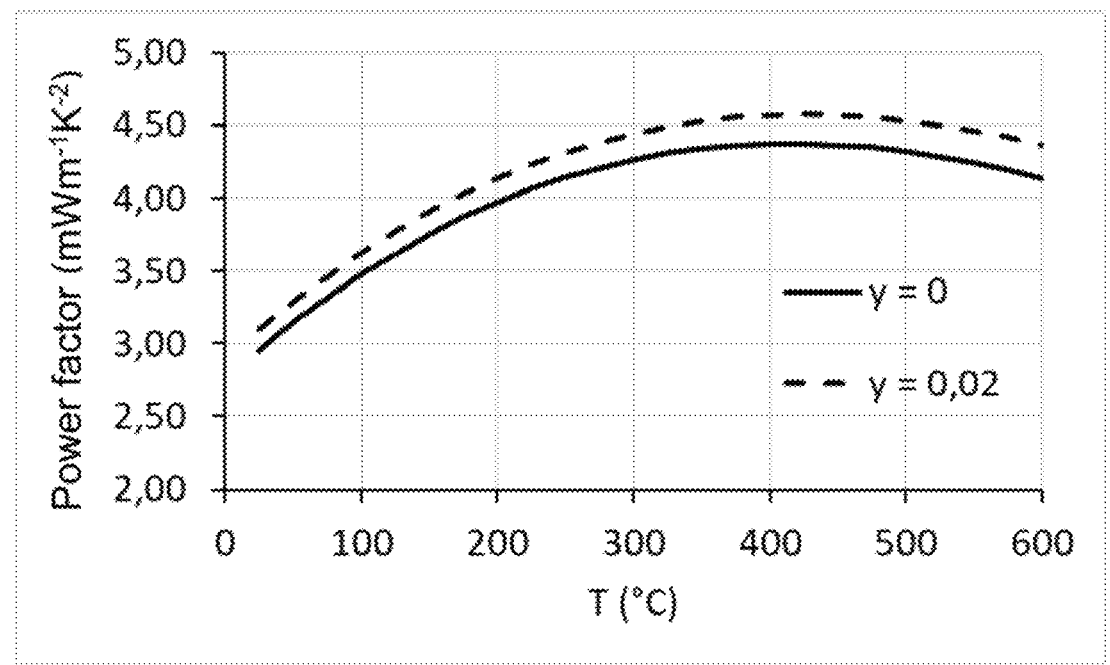
Figure 8D:
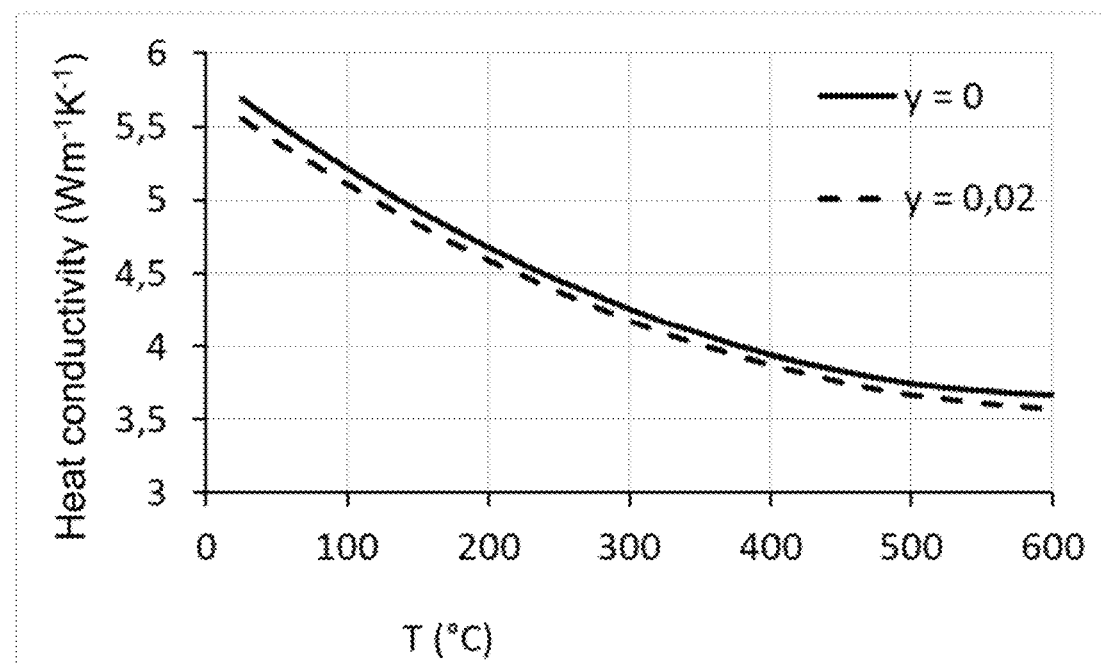
Figure 8E:
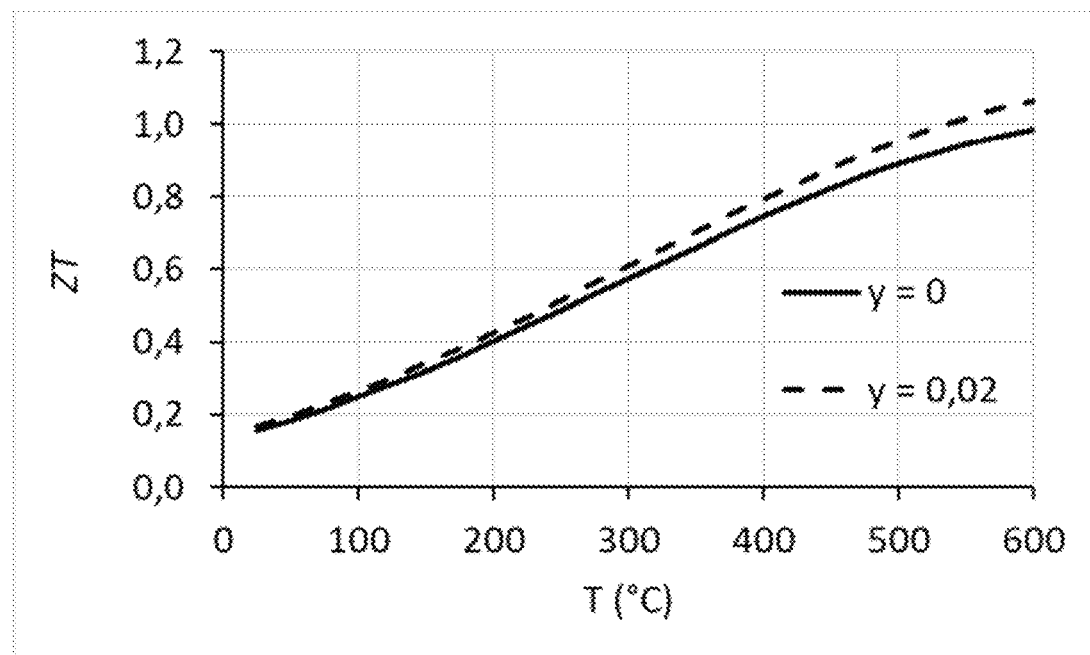
Figure 9A:
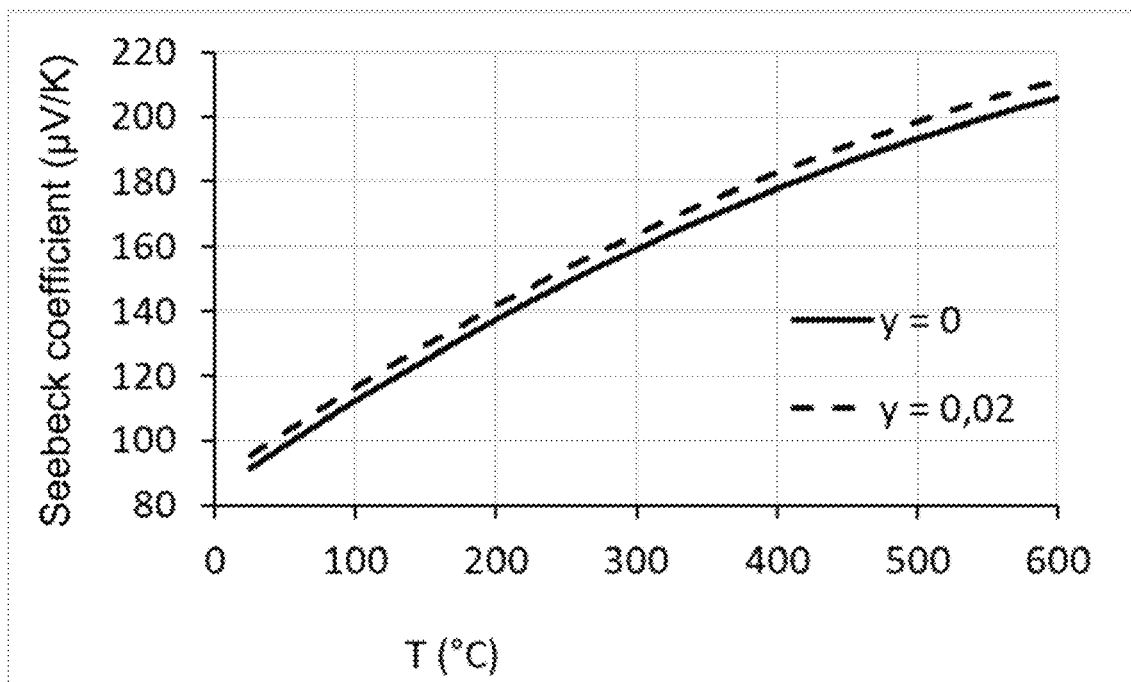
FIGS. 9a-9e show thermoelectric properties of the $Ti_{0.16}Ta_yV_{0.13}Nb_{0.71-y}FeSb$ compounds from Example 6.
Figure 9B:
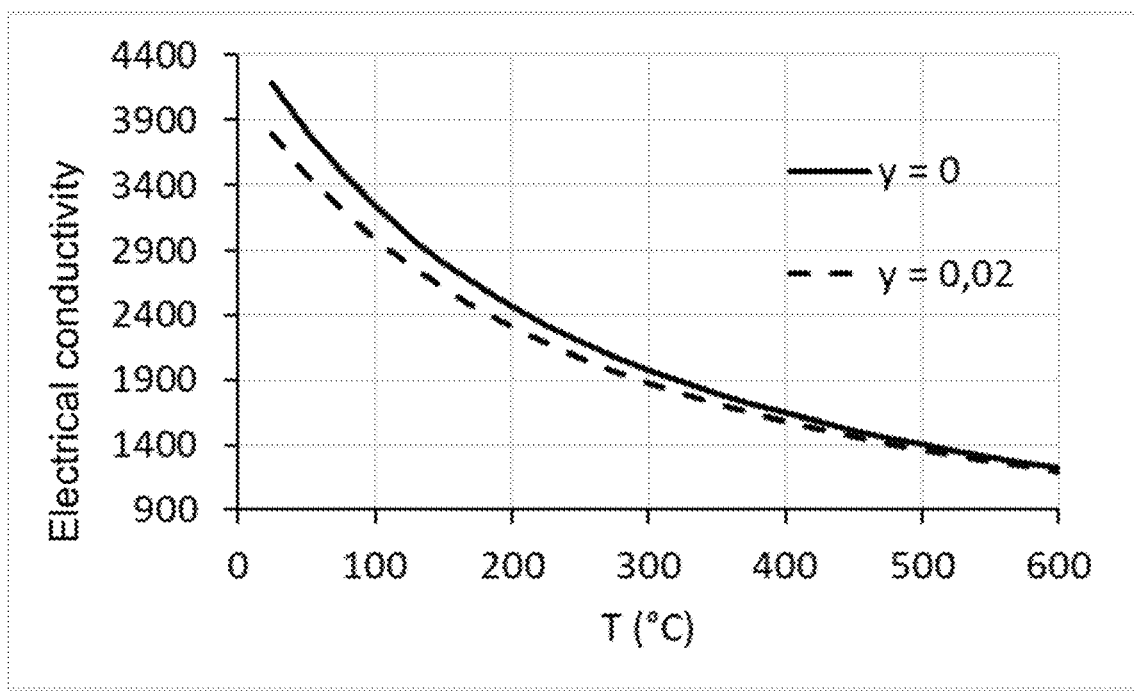
Figure 9C:
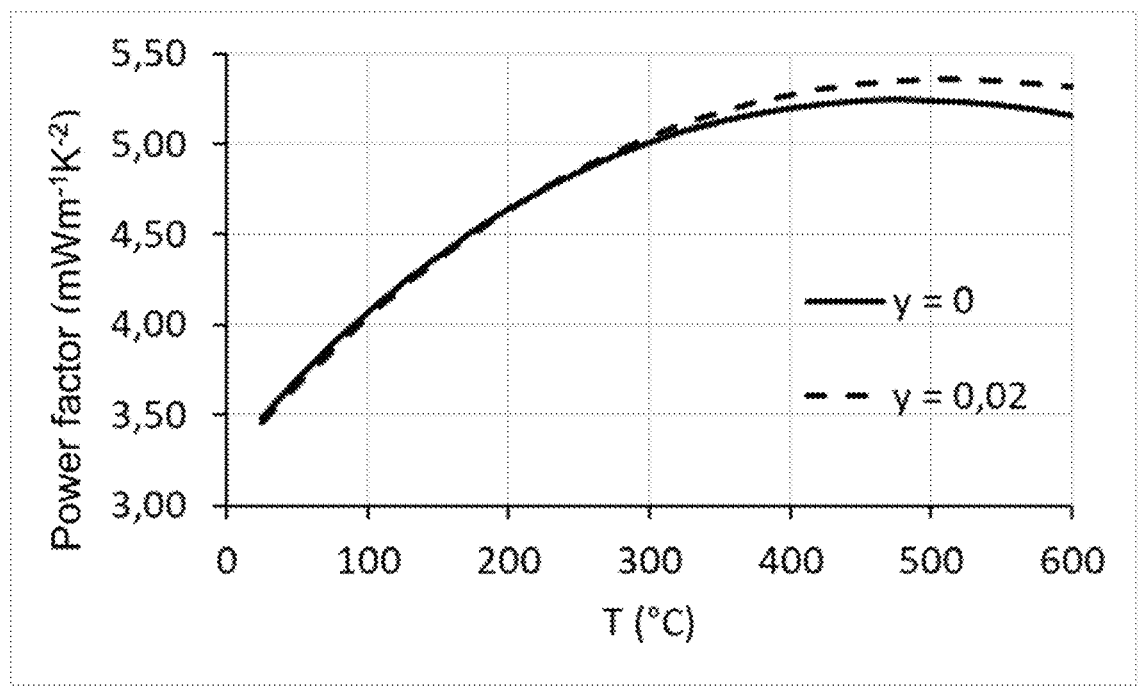
Figure 9D:
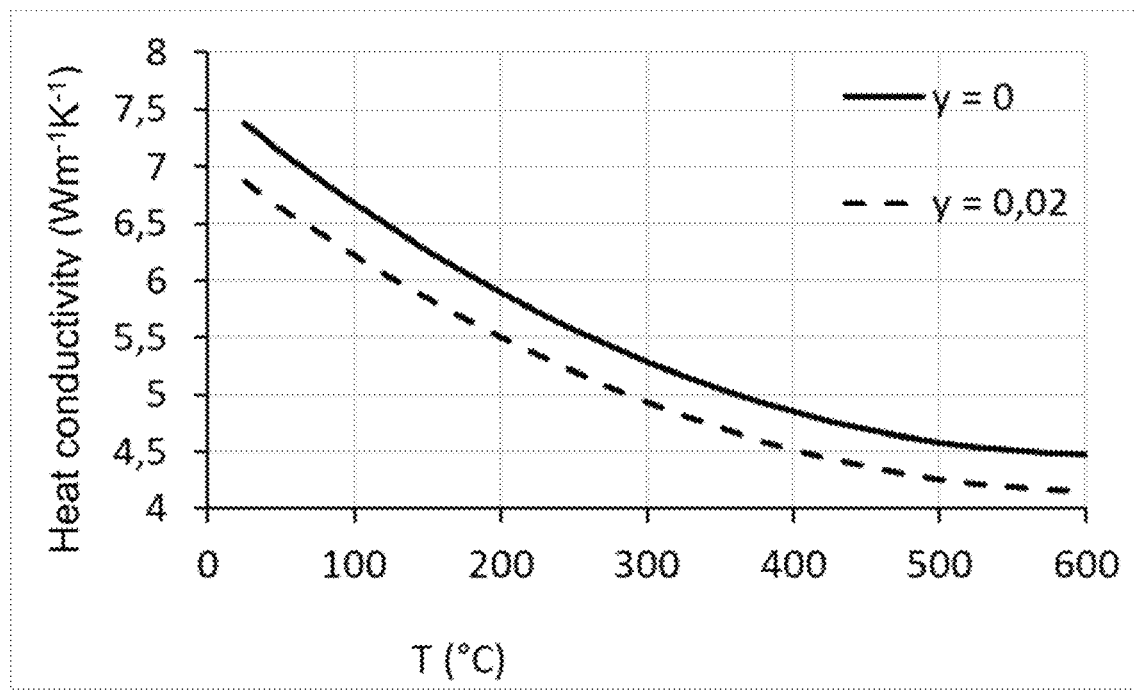
Figure 9E:
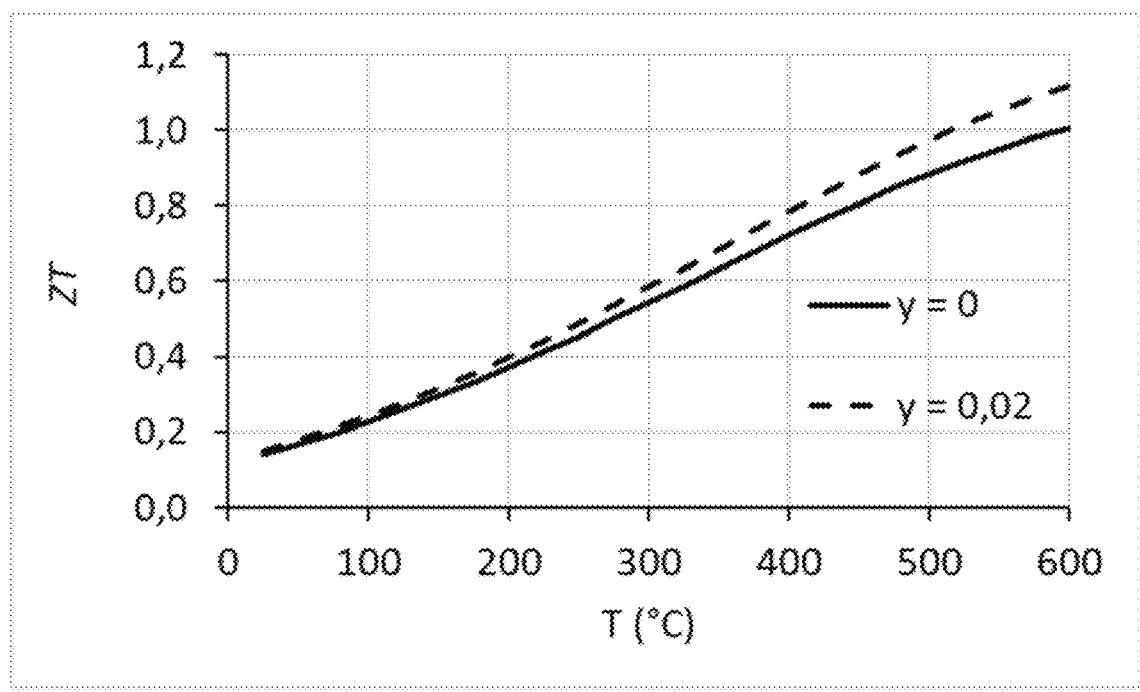
Figure 10A:
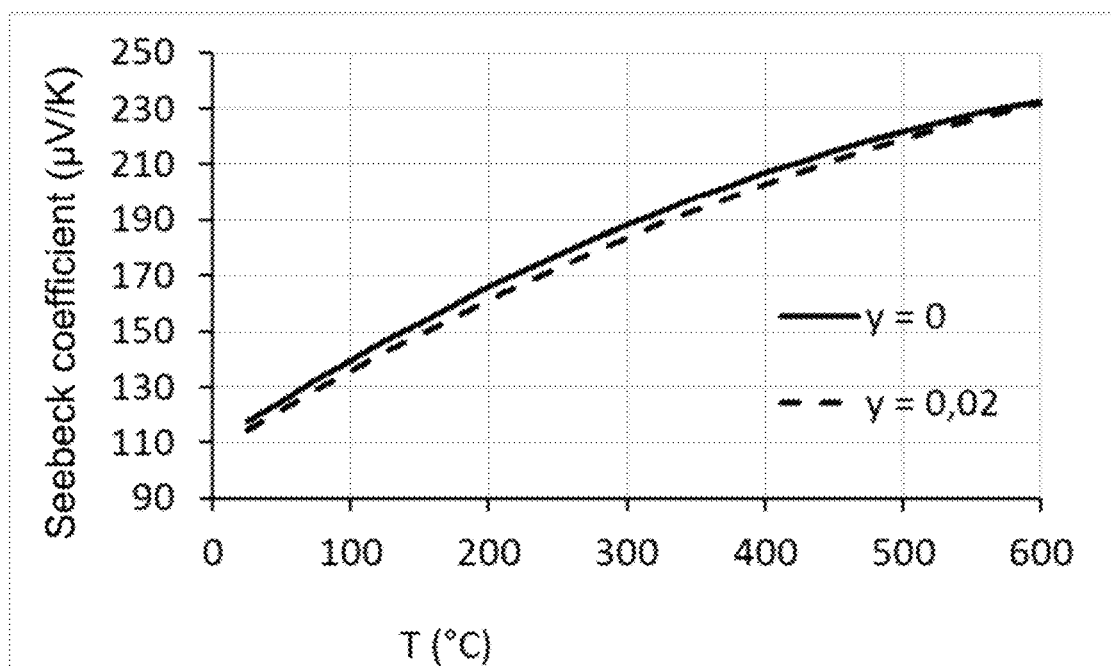
FIGS. 10a-10e show thermoelectric properties of the $Ti_{0.12}Ta_yV_{0.13}Nb_{0.75-y}FeSb$ compounds from Example 7.
Figure 10B:
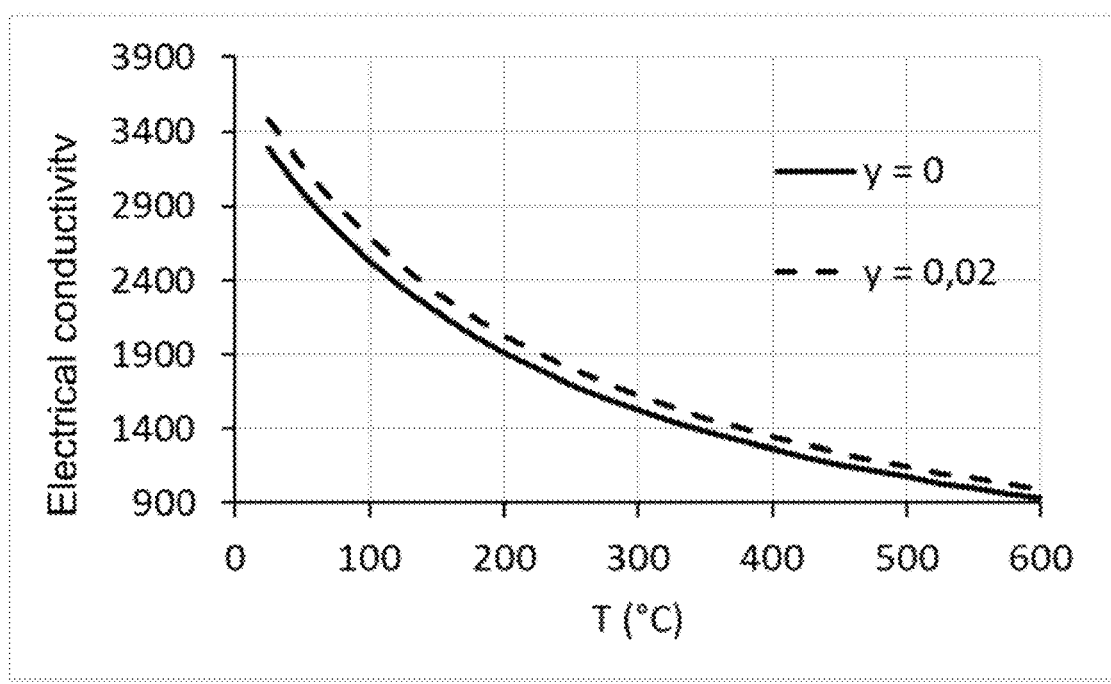
Figure 10C:
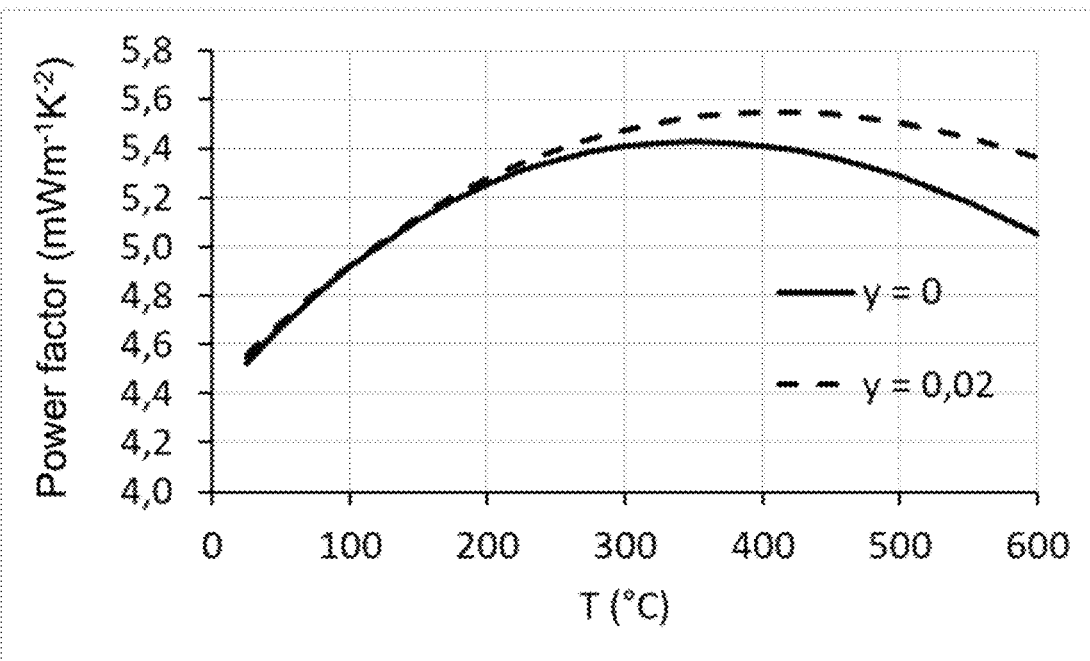
Figure 10D:
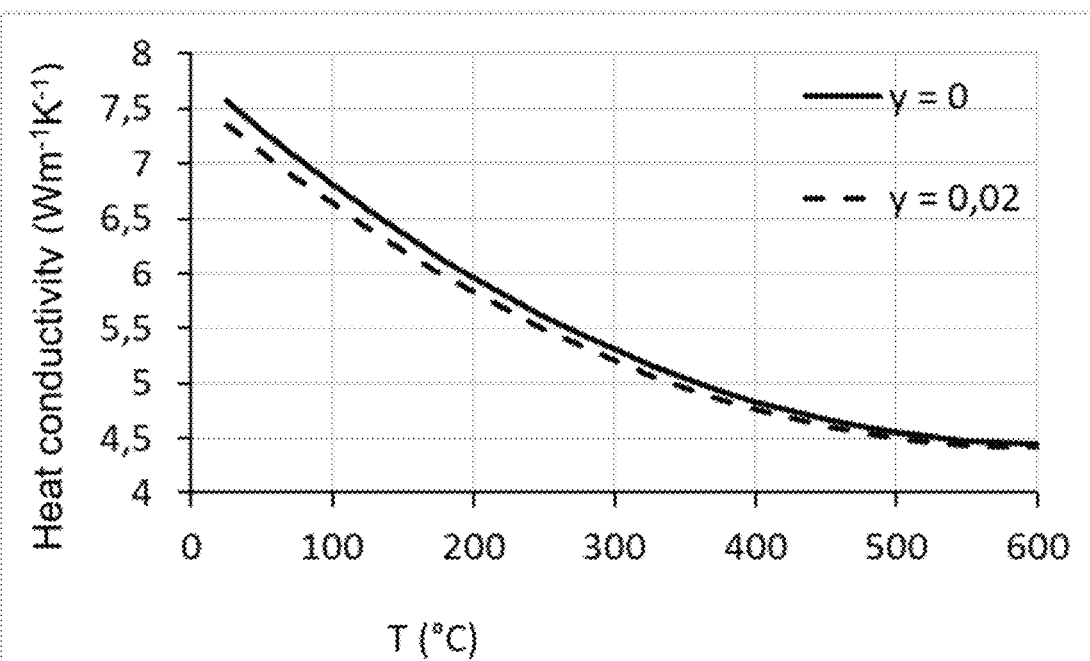
Figure 10E:
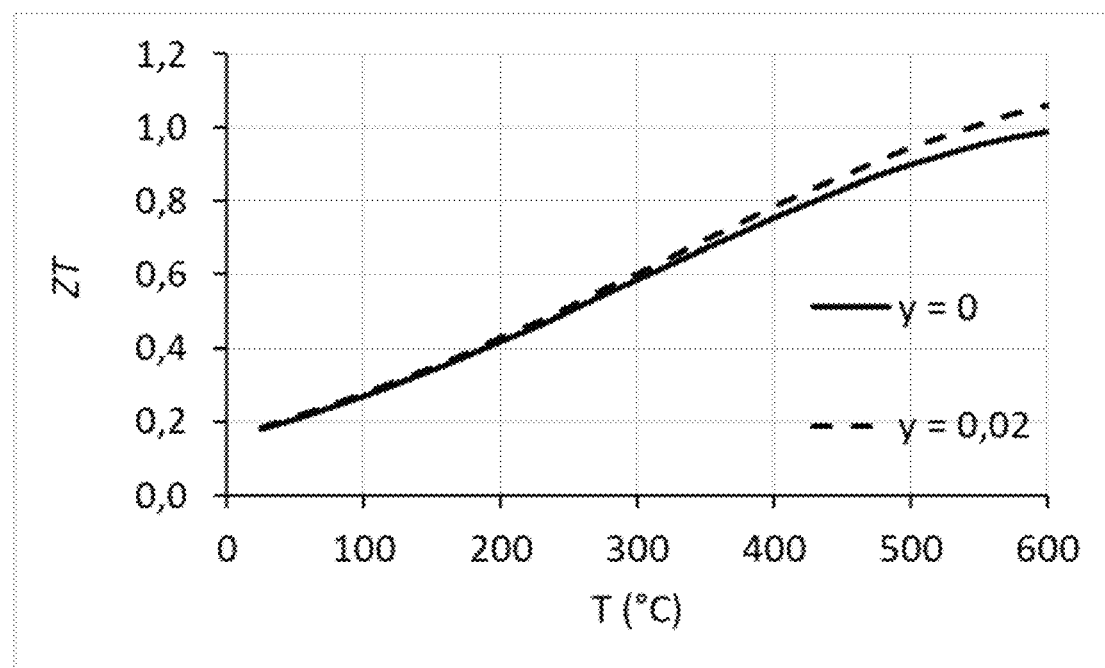

The thermoelectric properties of the samples produced in Example 2 were measured and the ZT values achieved evaluated. FIG. 5 shows the ZT values at 500° C. It was possible to achieve a clearly higher ZT value of 0.86 in the sample with a Ta content of y=0.03 than in the Ta-free compound, which has a ZT value of 0.82 at 500° C. As the Ta content increases further, so the ZT values falls due to the rise in foreign phases, though at y=0.045 it is still clearly above that of the Ta-free compound. Not until y=0.06 are ZT values lower than those of the Ta-free compound obtained.

With a V content of 0.24, the highest ZT value was thus measured at a Ta content of 0.03.

Example 3—According to the Invention

In Example 3 the influence of Ta content in a composition with a V content of 0.10 was investigated.

Using the same method as in Examples 1 and 2, compounds with the molecular formula $Ti_{0.2}Ta_yV_{0.10}Nb_{0.70-y}FeSb$ were produced with y=0; 0.02 and 0.03. Sintering temperatures of between 1060° C. and 1080° C. were required to achieve dense sinter samples. Following final homogenisation annealing at 950° C. for 48 hours the densities of the samples were determined at 8.03 g/cm³, 8.07 g/cm³ and 8.08 g/cm³. A relative density of 98.0% in relation to the theoretical density of 8.19 g/cm³ was therefore achieved for the Ta-free sample with y=0.

The thermoelectric properties of the samples were measured. The data obtained for 500° C. dependent on the Ta content y are shown in FIG. 6. Substitution with Ta leads to an improvement in the thermoelectric properties. While a ZT value just under 0.8 is achieved for the Ta-free compound, this figure rises to 0.87 for the sample with a Ta content of y=0.03.

The increase in the ZT value is due both to a decrease in electrical conductivity and to an improvement in electronic properties. An increase in the Seebeck coefficient overcompensates for a decrease in electrical conductivity, causing the power factor to rise as the Ta content increases.

Example 4—According to the Invention

In Example 4 the influence of Ta content in a composition with a V content of 0.18 was investigated.

The compounds with the molecular formula $Ti_{0.2}Ta_yV_{0.18}Nb_{0.62-y}FeSb$ were once again produced using the method set out in the preceding examples with y=0 and 0.02. The density of the samples was 7.76 g/cm³ and 7.81 g/cm³. A relative density of 95.6% in relation to the theoretical density of 8.12 g/cm³ was therefore reached for the Ta-free sample with y=0.

The temperature curve of the thermoelectric properties measured on the samples is shown in FIG. 7. As in the preceding Examples 2 and 3, improved thermoelectric properties were obtained by substitution with Ta. At 500° C. it was possible to increase the ZT value from 0.84 in the Ta-free sample to 0.93 in the sample with y=0.02. Once again, this increase is due to an improvement in the power factor and a drop in electrical conductivity.

Examples 5 to 7—According to the Invention

In Examples 2 to 4 above, the Ti content of the compounds remained constant at x=0.2. In the examples below the positive influence of the Ta is also demonstrated for an extended Ti range where x=0.16 and x=0.12. The compositions are summarised in Table 1. To this end the following compounds were produced using the method set out in the preceding examples.

TABLE 1

| Example 5 | $Ti_{0.16}Ta_yV_{0.25}Nb_{0.59-y}FeSb$ | y = 0 and 0.02 |
| Example 6 | $Ti_{0.16}Ta_yV_{0.13}Nb_{0.71-y}FeSb$ | y = 0 and 0.02 |
| Example 7 | $Ti_{0.12}Ta_yV_{0.13}Nb_{0.75-y}FeSb$ | y = 0 and 0.02 |

The thermoelectric properties were measured and the results are shown in FIGS. 8 to 10. In all cases an increase in the ZT value was once again recorded due to the addition of Ta. Consistent with the previous examples, this was the result of an increase in the power factor coupled with a drop in electrical conductivity.

The invention claimed is:
1. An alloy consisting essentially of

$$(Ti_xTa_yV_zA_cNb_{1-x-y-z-c})(Fe_{1-d}Mn_d)_a(Sb_{1-e}Sn_e)_b$$

wherein
$0.06 \leq x \leq 0.24$,
$0.01 \leq y \leq 0.045$,
$0.075 \leq z \leq 0.3$,
$0.9 \leq (a, b) \leq 1.1$,
$0 \leq c \leq 0.05$,
$0 \leq d \leq 0.05$,
$0 \leq e \leq 0.1$,
wherein A is one or more of the elements in the group consisting of Zr, Hf, Sc, Y, La, and up to 5 atom % impurities, and
wherein the alloy has a thermoelectric figure of merit ZT of ZT≥0.8, where T=500° C.

2. An alloy according to claim 1, wherein the alloy has a positive Seebeck coefficient.

3. An alloy according to claim 1, wherein c=0, d=0 and e=0.

4. A sintered article comprising an alloy according to claim 1.

5. A sintered article according to claim 4, wherein the sintered article has an average grain size of greater than 1.25 μm.

6. A sintered article according to claim 4, wherein the sintered article has a density D, D being ≥90% of the theoretic density $D_t$.

7. A thermoelectric module comprising at least one thermoelectric element made of an alloy according to claim 1 and having at least one thermoelectric element made of an N-type alloy.

8. A thermoelectric module comprising at least one thermoelectric element comprising a sintered article according to claim 4 and having at least one thermoelectric element made of an N-type thermoelectric alloy.

\* \* \* \* \*